(12) United States Patent
Tsao et al.

(10) Patent No.: US 12,733,509 B2
(45) Date of Patent: Sep. 8, 2026

(54) ALIGNMENT MARK VIA ASSEMBLIES FOR A COMPOSITE INTERPOSER AND METHODS OF USING THE SAME

(71) Applicant: Taiwan Semiconductor Manufacturing Company Limited, Hsinchu (TW)

(72) Inventors: Wei-An Tsao, Yuanlin Township (TW); Yu-Hsiang Hu, Hsinchu City (TW); Po-Han Wang, Hsinchu City (TW); Hung-Jui Kuo, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 659 days.

(21) Appl. No.: 18/300,104

(22) Filed: Apr. 13, 2023

(65) Prior Publication Data

US 2024/0347469 A1 Oct. 17, 2024

(51) Int. Cl.

| | |
|---|---|
| ***H10W 46/00*** | (2026.01) |
| ***H10W 70/63*** | (2026.01) |
| ***H10W 74/10*** | (2026.01) |
| ***H10W 90/00*** | (2026.01) |

(52) U.S. Cl.

CPC ......... *H10W 46/00* (2026.01); *H10W 70/635* (2026.01); *H10W 74/117* (2026.01); *H10W 90/701* (2026.01); *H10W 46/301* (2026.01)

(58) Field of Classification Search

None

See application file for complete search history.

(56) References Cited

U.S. PATENT DOCUMENTS

2011/0233736 A1* 9/2011 Park ...................... H01L 23/552 257/659
2012/0119335 A1 5/2012 Shen et al.
2014/0048948 A1* 2/2014 Lee ....................... H01L 23/481 257/774

FOREIGN PATENT DOCUMENTS

CN 105321801 B 12/2018

OTHER PUBLICATIONS

Jianq Chyun Intellectual Property Office; TW Application No. 112121316; Office Action mailed Jul. 31, 2024; 24 pages.

* cited by examiner

*Primary Examiner* — Jay C Chang

(74) *Attorney, Agent, or Firm* — The Marbury Law Group, PLLC

(57) ABSTRACT

A method of forming a semiconductor structure is provided, which includes forming via structures over a first carrier wafer. A unit via assembly structure is repeated in two directions over the first carrier wafer. Each instance of the unit via assembly is formed within a respective unit area of repetition. Each instance of the unit via assembly includes through integrated-fan-out via (TIV) structures and two alignment mark via assemblies located in two corner regions of a respective unit area and are diagonally spaced apart from each other. Corner locations of the unit areas of repetition may be identified using the alignment mark via assemblies within unit areas of repetition. At least one local silicon interconnect (LSI) bridge may be placed within each unit area of repetition using a pick and place tool.

20 Claims, 20 Drawing Sheets

484
311
OFDL1
486
405
486
UA
310
486
484
AMVA1
486

ALIGNMENT MARK VIA ASSEMBLIES FOR A COMPOSITE INTERPOSER AND METHODS OF USING THE SAME

BACKGROUND

A composite interposer including local silicon interconnect (LSI) structures may be formed by using a pick and place operation that places LSI structures on a carrier wafer, and subsequently depositing and patterning dielectric materials and conductive materials with precise alignment relative to the LSI structures. Misplacement of the LSI structures may cause electrical failures in the composite interposer, and thus, it is desirable to perform the pick and place operation within limits of allowable overlay tolerance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
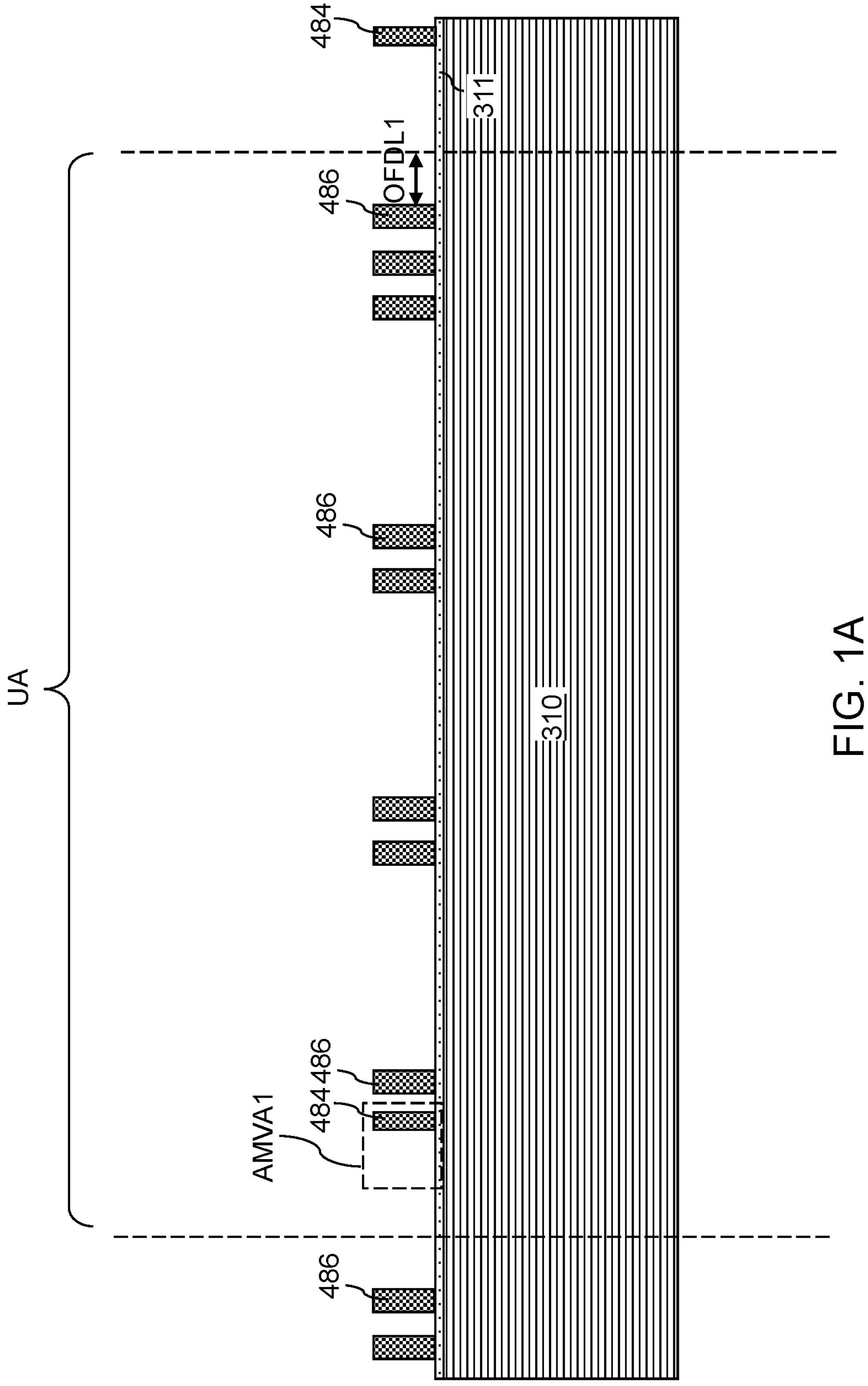
FIG. 1A is a vertical cross-sectional view of an embodiment structure after formation of a two-dimensional repetition of a unit via assembly over a first carrier wafer according to an embodiment of the present disclosure.
Figure 1B:
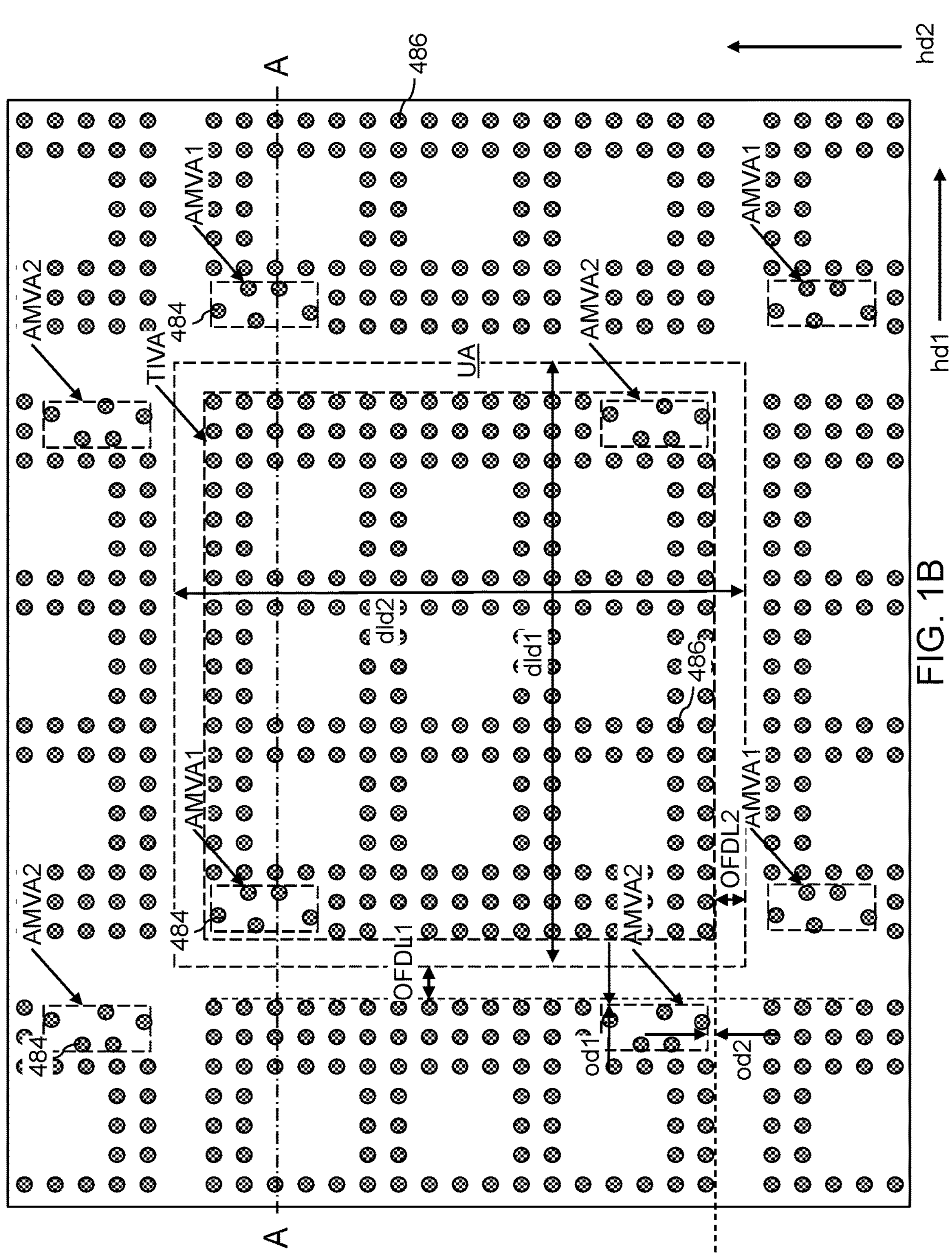
FIG. 1B is a top-down view of the embodiment structure of FIG. 1A.
Figure 1C:
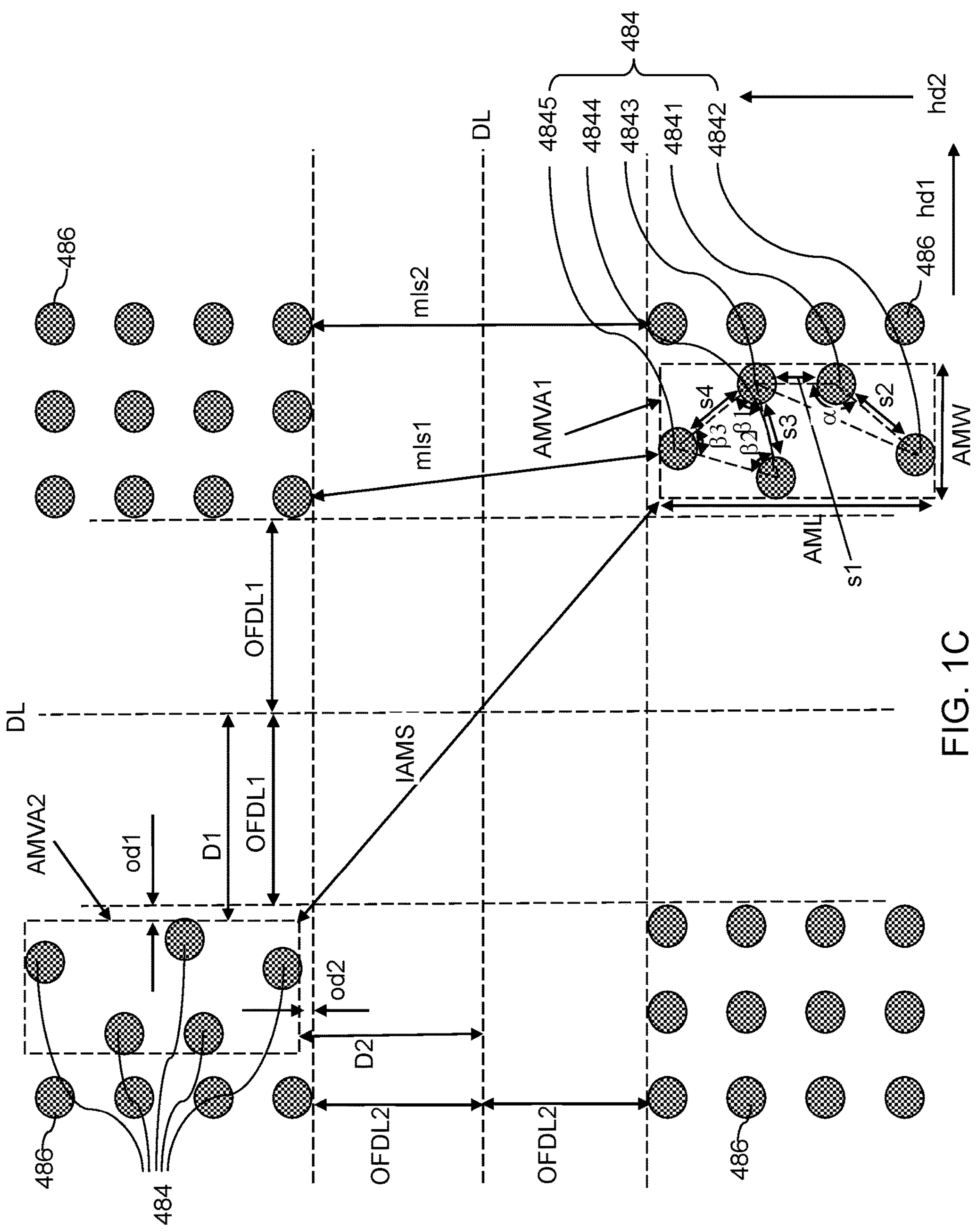
FIG. 1C is a magnified view of a portion of the top-down view of FIG. 1B.
Figure 1D:
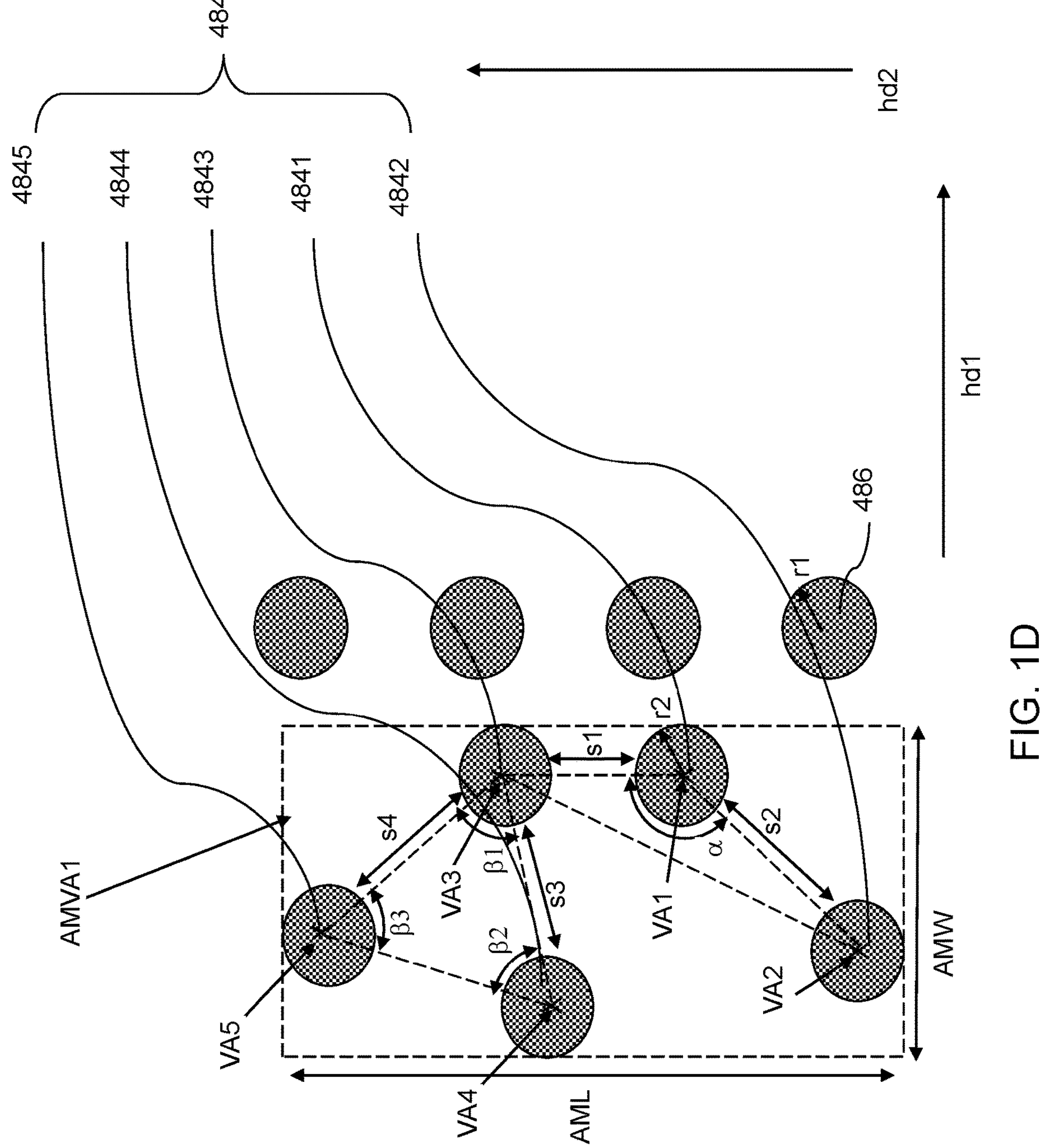
FIG. 1D is a magnified view of a portion of the view of FIG. 1C.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments disclosed herein may be directed to a semiconductor structure including a two-dimensional repetition of a unit via assembly. Each instance of the unit via assembly is located within a respective unit area. Each instance of the unit via assembly includes conductive via structures that vertically extends through a dielectric frame located within an interposer. The conductive via structures are referred to as through-interposer via structures (also referred to as TV or TIV structures). According to an aspect of the present disclosure, each instance of the unit via assembly includes two alignment mark via assemblies that include a respective set of alignment via structures located within a respective rectangular area. Each respective rectangular area may be defined by a respective smallest rectangle that includes an entire area of the respective set of alignment via structures. The alignment via structures may be offset dicing lines to prevent misidentification of patterns of the alignment via structures during a subsequent pick and place operation for placing local silicon interconnect (LSI) bridges. Specifically, the rectangular areas containing the alignment via structures may be laterally spaced from boundaries between unit areas of repetition at least by a maximum side length of the rectangular areas, and may be located within a rectangular area containing all TIV structures within a respective unit area. Various embodiments of the present disclosure are now described with reference to accompanying figures.

Referring to FIGS. 1A-1D, a structure according to an embodiment of the present disclosure is illustrated. The structure includes a first carrier wafer 310. The first carrier wafer 310 may include an optically transparent substrate such as a glass substrate or a sapphire substrate, or may comprise a semiconductor substrate such as a silicon substrate. The diameter of the first carrier wafer 310 may be in a range from 150 mm to 450 mm, although lesser and greater diameters may be used. The thickness of the first carrier wafer 310 may be in a range from 500 microns to 2,000 microns, although lesser and greater thicknesses may also be used. Alternatively, the first carrier wafer 310 may be provided in a rectangular panel format. A first adhesive layer 311 may be applied to a front-side surface of the first carrier wafer 310. In one embodiment, the first adhesive layer 311 may be a light-to-heat conversion (LTHC) layer. Alternatively, the first adhesive layer 311 may include a thermally decomposing adhesive material.

A two-dimensional repetition of a unit via assembly may be formed over a first carrier wafer 310. Each instance of the unit via assembly may be formed within a respective unit area UA having a rectangular area. Multiple instances of the unit via assembly may be repeated along a first horizontal direction hd1 and along a second horizontal direction hd2 that is perpendicular to the first horizontal direction hd1. The unit area UA corresponds to the area of an interposer die to be subsequently formed. For example, each unit area UA may have a rectangular shape having a first side length along the first horizontal direction hd1 and having a second side length along the second horizontal direction hd2. The first side length may be the length of a pair of first sides of the rectangular shape. The second side length may be the length of a pair of second sides of the rectangular shape. The first side length is herein referred to as a first die lateral dimension dld1. The second side length is herein referred to as a second die lateral dimension dld2. Each of the first die lateral dimension dld1 and the second die lateral dimension dld2 may be independently in a range from 300 microns to 6 cm, although lesser and greater dimensions may also be used.

Each instance of the unit via assembly may be formed within a respective unit area UA of repetition, and comprises a respective set of via structures (486, 484). Each instance of the unit via assembly comprises through interposer via (TIV) structures 486 and two alignment mark via assemblies (AMVA1, AMVA2) located in two corner regions of a respective unit area UA and may be diagonally spaced apart from each other. The TIV structures 486 may be conductive via structures that provide vertical electrical connections within an interposer, i.e., an interposer that includes redistribution structures that provide a fan-out configuration such that bonding pads on one side of the interposer and bonding pads on another side of the interposer have different pitches. Each alignment mark via assembly (AMVA1 or AMVA2) comprises a respective set of alignment via structures 484. According to an embodiment of the present disclosure, each set of alignment via structures 484 may comprise alignment via structures 484 that are arranged in a non-periodic pattern such that a pattern recognition tool may subsequently recognize the non-periodic pattern as an alignment pattern.

Generally, the TIV structures 486 and the alignment via structures 484 may be formed over the first adhesive layer 311 by deposition and patterning of a conductive material, or by transfer from above another carrier wafer.

In an illustrative example, a sacrificial matrix layer (not shown) may be formed over the first adhesive layer 311. The sacrificial matrix layer comprises a sacrificial material such as amorphous carbon, diamond-like carbon (DLC), a semiconductor material (such as amorphous silicon or a silicon-germanium alloy), or a dielectric material such as silicate glass or organosilicate glass. The thickness of the sacrificial matrix layer may be in a range from 3 microns to 60 microns, although lesser and greater thicknesses may also be used. A photoresist layer (not shown) may be applied over the sacrificial matrix layer. The photoresist layer may be lithographically pattered to form openings having a same pattern as the TIV structures 486 and the alignment via structures 484 to be subsequently formed in a top-down view. An anisotropic etch process may be formed to transfer the pattern of the openings in the photoresist layer. Cylinder cavities may be formed through the sacrificial matrix layer underneath the openings in the photoresist layer. The photoresist layer may be removed for example, by ashing. At least one conductive material, such as at least one metallic material, may be deposited in the cylindrical cavities. For example, the at least one conductive material may comprise a conductive metallic barrier material (such as TiN, TaN, WN, or MoN) and a metallic fill material (such as W, Ti, Ta, Mo, Ru, Co, etc.). Excess portions of the at least one conductive material may be removed from above the horizontal plate including the sacrificial matrix layer. Remaining portions of the at least one conductive material that fill the cylindrical cavities comprise the TIV structures 486 and the alignment via structures 484. Subsequently, the sacrificial matrix layer may be removed selective to the TIV structures 486 and the alignment via structures 484 and selective to the adhesive material layer 311.

Alternatively, at least one conductive material layer may be deposited as a blanket material layer, i.e., as an unpatterned material layer having a uniform thickness throughout. For example, the at least one conductive material layer may comprise a conductive metallic barrier material (such as TiN, TaN, WN, or MoN) and a metallic fill material (such as W, Ti, Ta, Mo, Ru, Co, etc.). The thickness of the at least one conductive material layer may be in a range from 3 microns to 60 microns, although lesser and greater thicknesses may also be used. A photoresist layer (not shown) may be applied over the at least one conductive material layer. The photoresist layer may be lithographically pattered to form discrete photoresist material portions having a same pattern as the TIV structures 486 and the alignment via structures 484 to be subsequently formed in a top-down view. An anisotropic etch process may be formed to transfer the pattern of the discrete photoresist material portions through the at least one conductive material layer. Patterned portions of the at least one conductive material layer comprise the TIV structures 486 and the alignment via structures 484.

In a further alternative embodiment, the TIV structures 486 and the alignment via structures 484 may be formed on another carrier wafer, and may be attached to the top surface of the adhesive layer 311. The TIV structures 486 and the alignment via structures 484 may be subsequently detached from the additional carrier wafer.

Generally, the TIV structures 486 within each instance of the unit via assembly may be formed entirely within a respective area, which is herein referred to as a TIV area (TIVA). Each TIVA may be less than the unit area UA. In one embodiment, each TIVA may be a rectangular area having two sides that are parallel to the first horizontal direction hd1 and having two sides that are parallel to the second horizontal direction hd2. Each TIVA may be defined by a periphery of a smallest rectangle having sides that are parallel to the first horizontal direction hd1 and having sides that are parallel to the second horizontal direction hd2 and including all areas of the TIV structures 486.

In one embodiment, the pattern of the TIV structures 486 within each unit area UA may be a pattern that is derived from a rectangular periodic array having a first pitch along the first horizontal direction hd1 and having a second pitch along the second horizontal direction hd2 by omitting a subset of the TIV structures 486. Specifically, omission of the subset of the TIV structures 486 may be made such that two rectangular corner regions are free of the TIV structures 486 and at least one center region is free of the TIV structures 486. The two rectangular corner regions correspond to the areas of the two alignment mark via assemblies (AMVA1, AMVA2). The at least one center region corresponds to at least one area in which at least one local silicon interconnect (LSI) bridge is to be positioned.

According to an aspect of the present disclosure, each of the two alignment mark via assemblies (AMVA1, AMVA2) in a respective unit area UA comprises a respective set of alignment via structures 484 located within a respective rectangular area defined by a respective smallest rectangle that includes an entire area of the respective set of alignment via structures 484. In other words, each alignment mark via assembly (AMVA1, AMVA2) may comprise a set of alignment via structures 484, and the entirety of the set of alignment via structures 484 may be located within a rectangular area. The rectangular area is defined by the smallest rectangle that includes the entire area of the set of alignment via structures 484. The rectangular area is defined by two sides that are parallel to the first horizontal direction hd1 and two sides that are parallel to the second horizontal direction hd2.

A maximum side length of a rectangular area is defined as the greatest of all side lengths of the rectangular area. For example, each rectangular area of an alignment mark via assembly (AMVA1, AMVA2) may have an alignment mark region length (AML) and an alignment mark region width (AMW). The alignment mark region length AML is the length of longer sides of the rectangular area (or the equal side in embodiments in which the rectangular area is a square area), and the alignment mark region width AMW is the length of shorter sides of the rectangular area (or the equal side in embodiments in which the rectangular area is a square area). In this embodiment, the maximum side length is the alignment mark region length AML. In one embodiment, the alignment mark region length AML may be in a range from 100 microns to 500 microns, such as from 140 microns to 400 microns; and the alignment mark region width AMW may be in a range from 40 microns to 400 microns, such as from 60 microns to 300 microns, although lesser and greater dimensions may be used for each of the alignment mark region length AML and the alignment mark region width AMW.

According to an embodiment of the present disclosure, the rectangular areas of the alignment mark via assemblies (AMVA1, AMVA2) may be laterally spaced from boundaries between unit areas UA of repetition at least by the maximum side length (i.e., the alignment mark region length AML) of the rectangular areas. The boundaries between the unit areas UA of repetition correspond to dicing lines DL, i.e., dicing channels, along which a reconstituted wafer to be subsequently formed is diced.

In one embodiment, each of the TIV structures 486 and the alignment via structures 484 comprises a metallic via structure. In one embodiment, each set of alignment via structures 484 within a unit via assembly comprises a respective set of metallic via structures. In one embodiment, the metallic via structures comprise a same material as, and has a same material composition as, the TIV structures 486. In one embodiment, each of the TIV structures 486 has a respective cylindrical shape with a first radius r1 in a respective horizontal cross-sectional shape, and each of the alignment via structures 484 has a respective cylindrical shape with a second radius r2 in a respective horizontal cross-sectional shape. In one embodiment, the second radius r2 may, or may not, be the same as the first radius r1; and the TIV structures 486 and the alignment via structures 484 have a same height. In an illustrative example, the first radius r1 and the second radius r2 may be independently in a range from 10 microns to 100 microns, such as from 20 microns to 60 microns, although lesser and greater radii may also be used.

According to an aspect of the present disclosure, each of the two alignment mark via assemblies (AMVA1, AMVA2) in each instance of the unit via assembly may have a non-periodic pattern that provides recognition by a pattern recognition tool as alignment marks. In one embodiment, each of the two alignment mark via assemblies (AMVA1, AMVA2) in each instance of the unit via assembly comprises: a first alignment via structure 4841 having a first vertical axis VA1 passing through a geometrical center thereof; a second alignment via structure 4842 having a second vertical axis VA2 passing through a geometrical center thereof; and a third alignment via structure 4843 having a third vertical axis VA3 passing through a geometrical center thereof, and the first vertical axis VA1, the second vertical axis VA2, and the third vertical axis VA3 form an obtuse triangle in a top-down view such that an obtuse angle $\alpha$ is located at a corner located at the first vertical axis VA1. In one embodiment, the obtuse angle $\alpha$ is greater than 90 degrees, and may be in a range from 100 degrees to 160 degrees, such as from 110 degrees to 140 degrees. A geometrical center of an element refers to the center of gravity of a hypothetical object that occupies a same volume as the element and having a uniform density throughout. In one embodiment, the alignment via structures 484 may have a circular cylindrical shape, and the vertical axis of each alignment via structure 484 may be the axis of rotational symmetry along the vertical direction.

In one embodiment, each of the two alignment mark via assemblies (AMVA1, AMVA2) in each instance of the unit via assembly comprises: a fourth alignment via structure 4844 having a fourth vertical axis VA4 passing through a geometrical center thereof; and a fifth alignment via structure 4845 having a fifth vertical axis VA5 passing through a geometrical center thereof, and the third vertical axis VA3, the fourth vertical axis VA4, and the fifth vertical axis VA5 form three corners of an acute triangle in the top-down view. The acute triangle may have a first acute angle β1, a second acute angle β2, and a third acute angle β3 as inner angles. In one embodiment, each of the first acute angle β1, the second acute angle β2, and the third acute angle β3 may be in a range from 10 degrees to 80 degrees, such as from 15 degrees to 70 degrees.

In one embodiment, within each of the two alignment mark via assemblies (AMVA1, AMVA2) in each instance of the unit via assembly, each line connecting a geometrical center of an alignment via structure 484 and a geometric center of another alignment via structure 484 may be not parallel to the first horizontal direction hd1 and not parallel to the second horizontal direction hd2 in a plan view. In other words, each vertical plane connecting two vertical axes of the alignment via structures 484 may be not parallel to the first horizontal direction hd1 and not parallel to the second horizontal direction hd2 to facilitate recognition of the patterns of the alignment mark via assemblies (AMVA1, AMVA2) as alignment marks that are different from the TIV structures 486.

In one embodiment, within each of the two alignment mark via assemblies (AMVA1, AMVA2) in each instance of the unit via assembly, the second alignment via structure 4842 is laterally spaced from the first alignment via structure 4841 by a first spacing s2, the third alignment via structure 4843 is spaced from the first alignment via structure 4841 by a second spacing s1, the fourth alignment via structure 4844 is spaced from the third alignment via structure 4843 by a third spacing s3, the fifth alignment via structure 4845 is spaced from the third alignment via structure 4843 by a fourth spacing s4. Each of the first spacing s1, the second spacing s2, the third spacing s3, and the fourth spacing s4 may be independently in a range from 10 microns to 100 microns, such as from 20 microns to 60 microns, although lesser and greater spacings may also be used. In some embodiments, the fourth spacing s4 may be the same as the third spacing s3.

In one embodiment, for each alignment mark via assembly (AMVA1, AMVA2) located within one, a plurality, and/or each, of the unit via assemblies (486, 484), a minimum lateral spacing mls1 between the alignment mark via assembly (AMVA1, AMVA2) and a neighboring unit via assembly (486, 484) is greater than a minimum lateral spacing mls2 between one of TIV structures 486 within a respective unit via assembly (486, 484) that contains the alignment mark via assembly (AMVA1, AMVA2) and the neighboring unit via assembly (486, 484).

In one embodiment, each TIVA may be laterally spaced from most proximal dicing lines DL laterally extending along the second horizontal direction hd2 by a first offset-from-dicing-line OFDL1 along the first horizontal direction hd1; and each TIVA may be laterally spaced from most proximal dicing lines DL laterally extending along the first horizontal direction hd1 by a second offset-from-dicing-line OFDL2 along the second horizontal direction hd2. In one embodiment, each of the first offset-from-dicing-line OFDL1 and the second offset-from-dicing-line OFDL2 may be greater than 0.5 mm, and/or greater than 0.6 mm, and/or greater than 0.7 mm.

In one embodiment, neighboring instances of the unit via assembly (486, 484) that are laterally spaced apart along the first horizontal direction hd1 are laterally spaced apart by a first assembly spacing (which is two times the first offset-from-dicing-line OFDL1); and neighboring instances of the unit via assembly (486, 484) that are laterally spaced apart along the second horizontal direction hd2 are laterally spaced apart by a second assembly spacing (which is two times the second offset-from-dicing-line OFDL2).

In one embodiment, each rectangle that defines the area of one, a plurality, or each, of the alignment mark via assemblies (AMVA1, AMVA2) may be laterally offset from a most proximal periphery of a respective TIV are TIVA by a first offset distance od1 along the first horizontal direction hd1, and by a second offset distance od2 along the second horizontal direction hd2. In one embodiment, each of the first offset distance od1 and the second offset distance od2 may be independently in a range from 1 micron to 40 microns, such as from 2 microns to 20 microns. As discussed above, each rectangle that defines the area of a respective alignment mark via assembly (AMVA1, AMVA2) is a smallest rectangle having first sides that are parallel to the first horizontal direction hd1 and having second sides that are parallel to the second horizontal direction hd2 and including the entirety of the areas of the alignment via structures 484 within the respective alignment mark via assembly (AMVA1, AMVA2). Thus, the alignment mark via assemblies (AMVA1, AMVA2) may be laterally offset inward from the periphery of a respective TIVA. According to an aspect of the present disclosure, the inward lateral offset of the alignment mark via assemblies (AMVA1, AMVA2) from peripheries of the TIVA increases the inter-alignment mark spacing IAMS between neighboring pairs of alignment mark via assemblies (AMVA1, AMVA2), and thus, reduces the probability of misidentification of patterns of the TIV structures 486 as a component of the pattern of the alignment mark via assemblies (AMVA1, AMVA2).

In one embodiment, neighboring instances of the alignment mark via assemblies (AMVA1, AMVA2) are laterally spaced apart from each other by a lateral spacing, which is the inter-alignment mark spacing IAMS, that is greater than a square root of a sum of a square of the first assembly spacing (which is two times the first offset-from-dicing-line OFDL1) and a square of the second assembly spacing (which is two times the second offset-from-dicing-line OFDL2).

In one embodiment, the first assembly spacing (which is two times the first offset-from-dicing-line OFDL1) is at least 1 mm; and the second assembly spacing (which is two times the second offset-from-dicing-line OFDL2) is at least 1 mm. Each side length (AML and AMW) of the rectangular areas of the alignment mark via assemblies (AMVA1, AMVA2) is less than one half of the first assembly spacing, i.e., less than the first offset-from-dicing-line OFDL1, and is less than one half of the second assembly spacing, i.e., less than the second offset-from-dicing-line OFDL2.

Figure 2A:
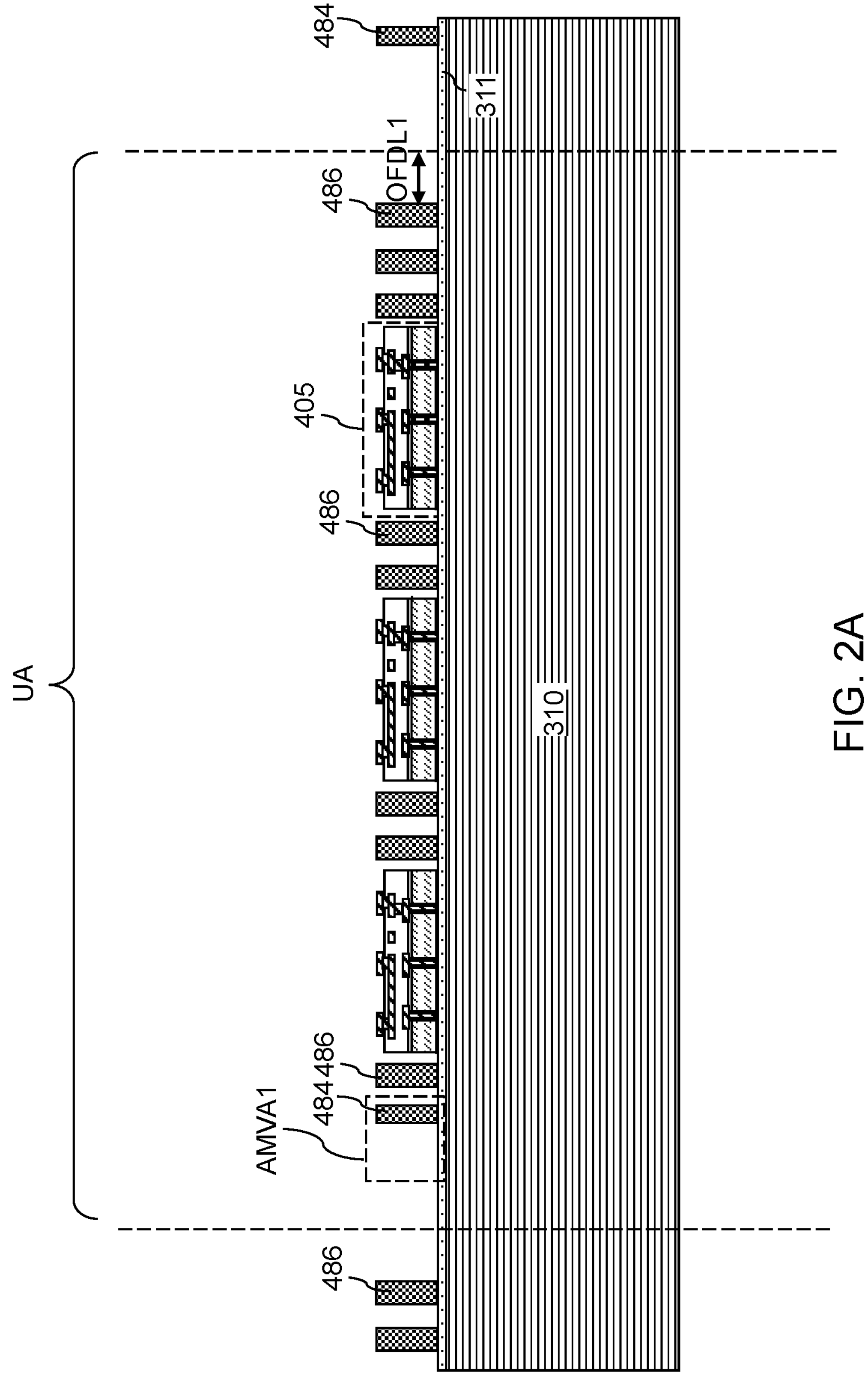
FIG. 2A is a vertical cross-sectional view of an embodiment structure after attaching local silicon interconnect (LSI) bridges to the first carrier wafer according to an embodiment of the present disclosure.
Figure 2B:
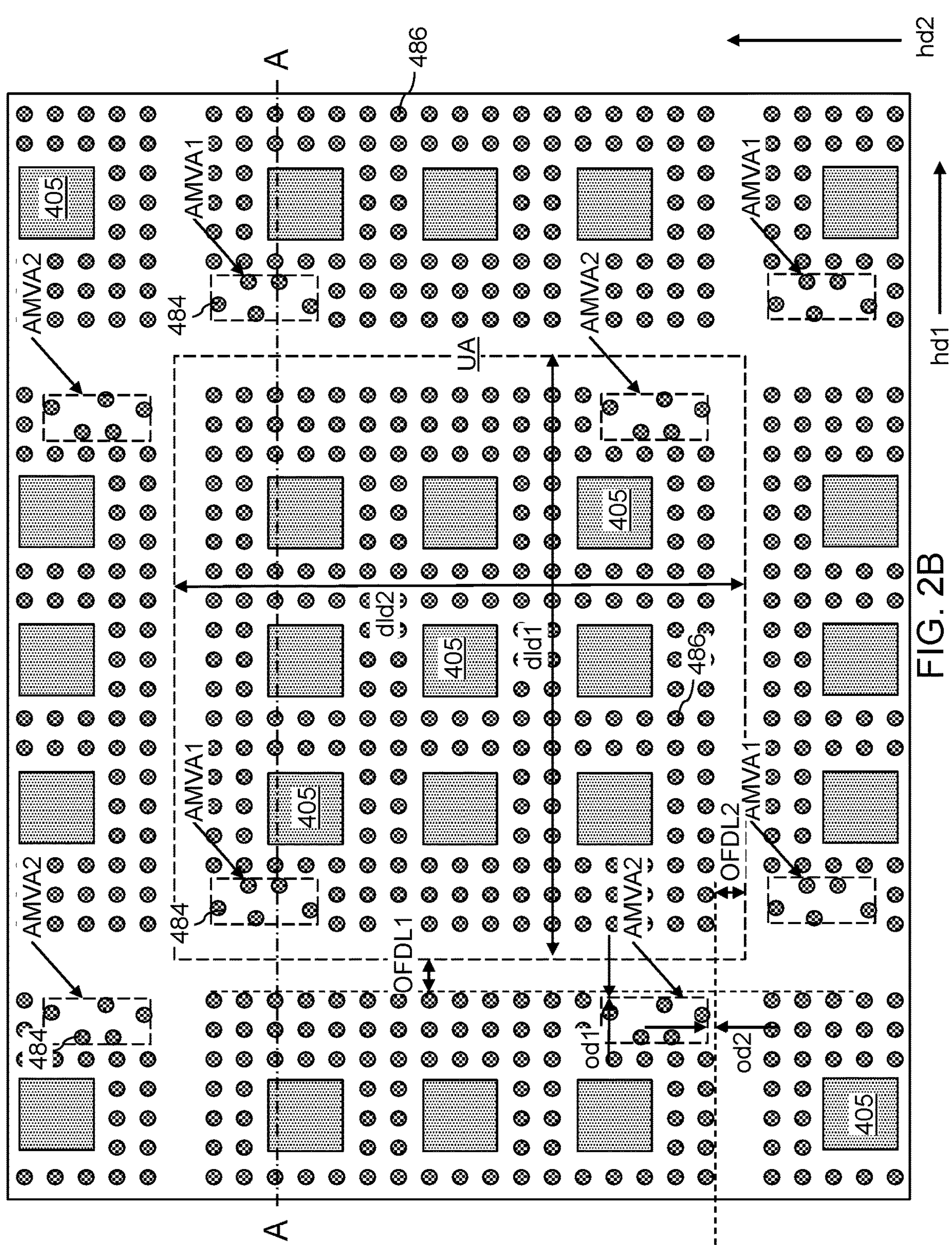
FIG. 2B is a top-down view of the embodiment structure of FIG. 2A.
Figure 2C:
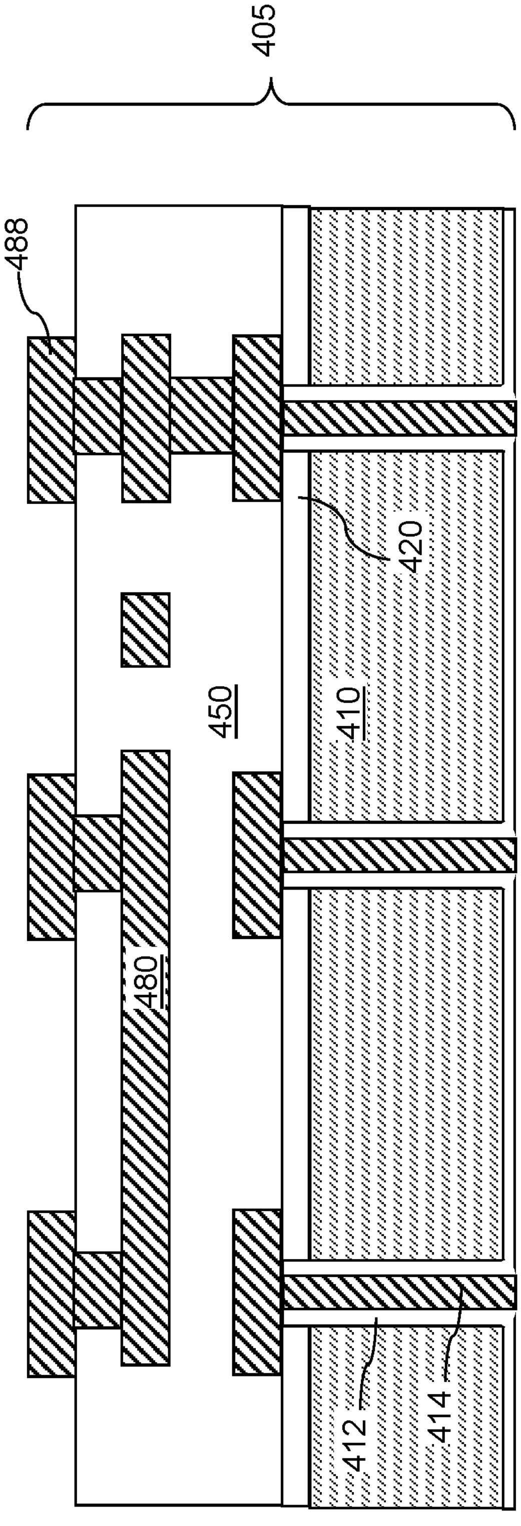
FIG. 2C is a vertical cross-sectional view of an LSI bridge in the embodiment structure of FIGS. 2A and 2B.

Referring to FIGS. 2A-2C, a plurality of local silicon interconnect (LSI) bridges 405 may be provided. Each LSI bridge 405 includes a silicon substrate 410 (as thinned and diced during manufacturing of the local silicon interconnect bridge 405), through-silicon via structures 414 vertically extending through the silicon substrate 410, through-substrate openings that vertically extend through the silicon substrate 410, a dielectric liner 412 that provides electrical isolation for the through-silicon via structures 414, backside dielectric material layer 420, and metal interconnect structures 480 embedded in dielectric material layers 450 and electrically connected to the through-silicon via structures 414 and/or electrically connected to one another. Metal pads, which are herein referred to as LSI metal pads 488, may be provided on the topmost metal interconnect structures 480.

The LSI bridges 405 may be placed within openings in the arrays of the TIV structures 486 on the top surface of the first adhesive layer 311. Generally, a pick and place tool may be used to place at least one LSI bridge 405 within each unit area UA. According to an aspect of the present disclosure, corner locations of the unit areas UA of repetition may be identified using the alignment mark via assemblies (AMVA1, AMVA2) within the unit areas UA of repetition using a pattern recognition apparatus within the pick and place tool. At least one local silicon interconnect (LSI) bridge 405 may be placed within each unit area UA of repetition using the pick and place tool. In one embodiment, a plurality of LSI bridges 405 may be placed within each unit area UA of repetition using the pick and place tool.

Figure 3:
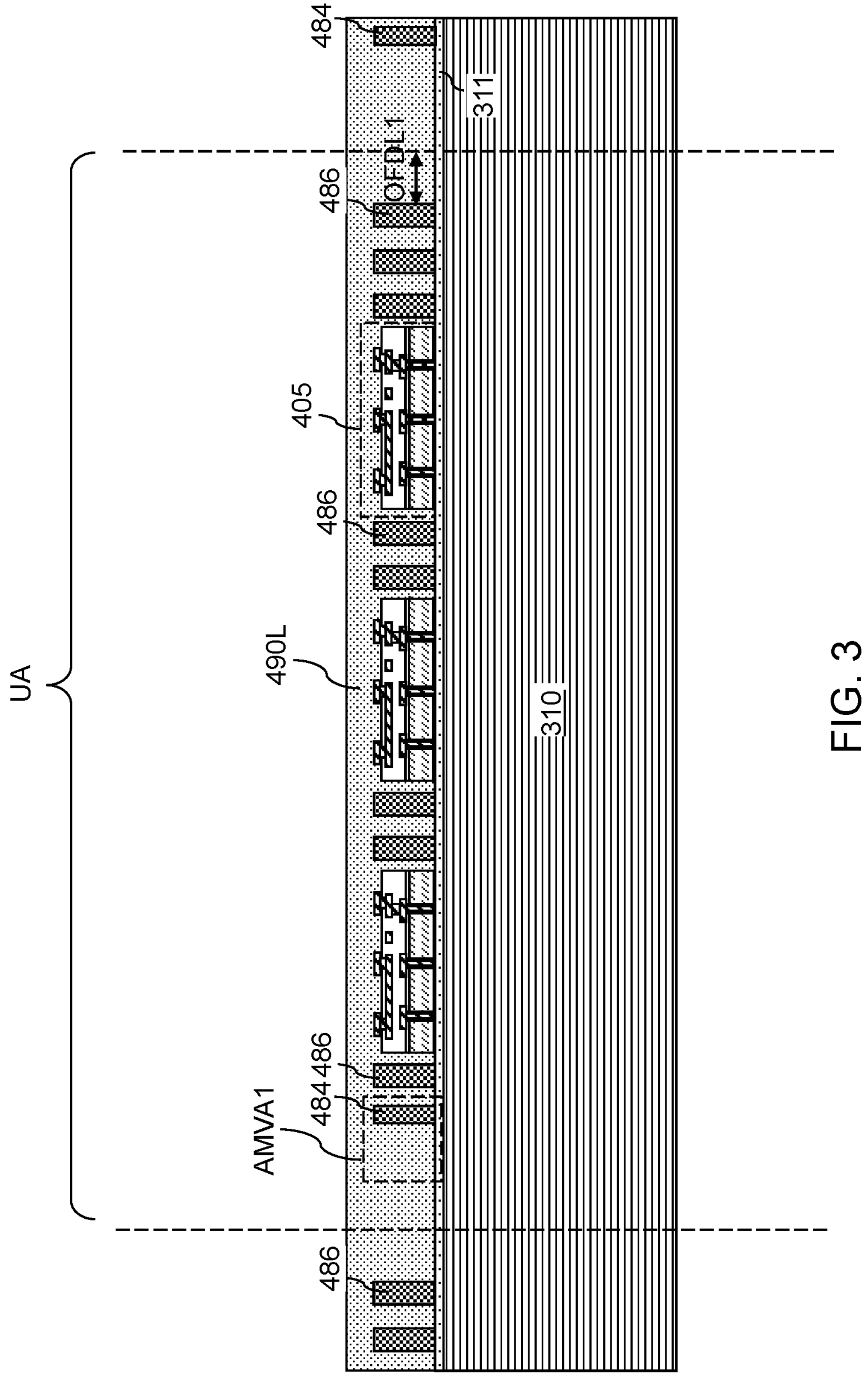
FIG. 3 is a vertical cross-sectional view of the embodiment structure after formation of an interposer-level molding compound material layer according to an embodiment of the present disclosure.

Referring to FIG. 3, an encapsulant, such as a molding compound (MC) may be applied to the gaps within the assembly of the LSI bridges 405 and the TIV structures 486. The MC includes an epoxy-containing compound that may be hardened (i.e., cured) to provide a dielectric material portion having sufficient stiffness and mechanical strength. The MC may include epoxy resin, hardener, silica (as a filler material), and other additives. The MC may be provided in a liquid form or in a solid form depending on the viscosity and flowability. Liquid MC typically provides better handling, good flowability, less voids, better fill, and less flow marks. Solid MC typically provides less cure shrinkage, better stand-off, and less die drift. A high filler content (such as 85% in weight) within an MC may shorten the time in mold, lower the mold shrinkage, and reduce the mold warpage. Uniform filler size distribution in the MC may reduce flow marks, and may enhance flowability.

The MC may be cured at a curing temperature to form an MC matrix, which is herein referred to as a first molding compound (MC) material layer or an interposer-level molding compound (MC) material layer 490L. The interposer-level MC material layer 490L laterally encloses each of the LSI bridges 405 and the TIV structures 486. The interposer-level MC material layer 490L may be a continuous material layer that extends across the entirety of the area of a reconstituted wafer overlying the first carrier wafer 310.

Figure 4:
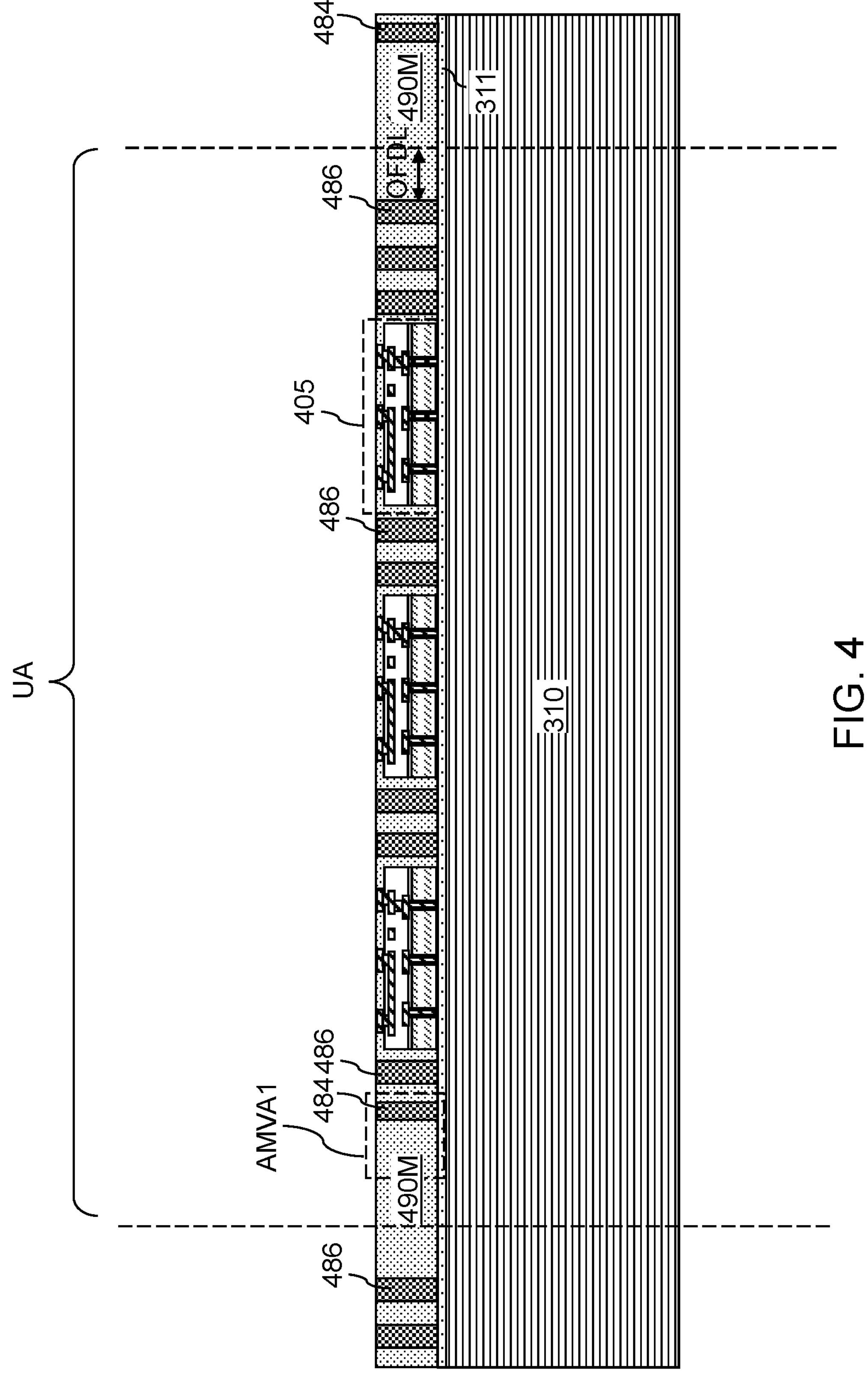
FIG. 4 is a vertical cross-sectional view of the embodiment structure after formation of an interposer-level molding compound matrix according to an embodiment of the present disclosure.

Referring to FIG. 4, excess portions of the interposer-level MC material layer 490L may be removed from above the horizontal plane including the top surfaces of the LSI bridge 405 and the TIV structures 486 by a planarization process, which may use chemical mechanical planarization (CMP). Surfaces of the through-silicon via structures 414 may be physically exposed after the planarization process. The remaining portion of the interposer-level MC material layer 490L is herein referred to as an interposer-level molding compound (MC) matrix 490M.

The interposer-level MC matrix 490M includes a plurality of molding compound (MC) interposer frames located within a respective unit area UA and are laterally adjoined to one another. Each MC interposer frame corresponds to a portion of the interposer-level MC matrix 490M located within a unit area UA, i.e., an area of a single interposer to be subsequently formed. Each MC interposer frame laterally surrounds a respective set of at least one LSI bridge 405 and a respective array of TIV structures 486.

Figure 5:
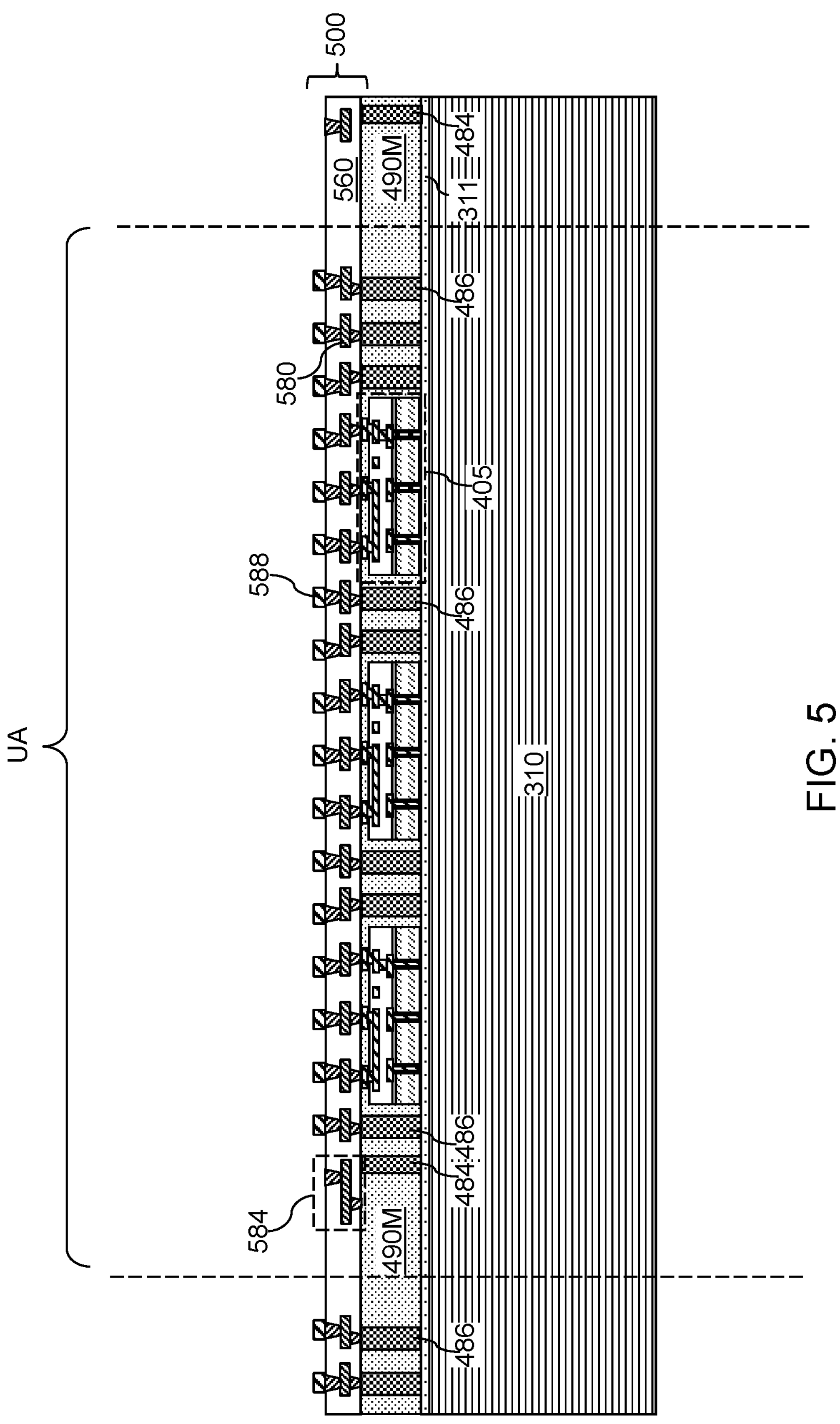
FIG. 5 is a vertical cross-sectional view of the embodiment structure after formation of a first redistribution structure according to an embodiment of the present disclosure.

Referring to FIG. 5, a first redistribution structure 500 may be formed on a top side of the two-dimensional repetition of the unit via assembly and the interposer-level MC matrix 490M. The first redistribution structure 500 comprises first redistribution wiring interconnects 580, optional first interconnect-level alignment structures 584, first redistribution dielectric layers 560, and first bonding structures 588.

The first redistribution dielectric layers 560 include a respective dielectric polymer material such as polyimide (PI), benzocyclobutene (BCB), or polybenzobisoxazole (PBO). Each first redistribution dielectric layer 560 may be formed by spin coating and drying of the respective dielectric polymer material. The thickness of each first redistribution dielectric layer 560 may be in a range from 2 microns to 40 microns, such as from 4 microns to 20 microns. Each first redistribution dielectric layer 560 may be patterned, for example, by applying and patterning a respective photoresist layer thereabove, and by transferring the pattern in the photoresist layer into the first redistribution dielectric layer 560 using an etch process such as an anisotropic etch process. The photoresist layer may be subsequently removed, for example, by ashing.

Each of the first redistribution wiring interconnects 580 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the first redistribution wiring interconnects 580 may include copper, nickel, or copper and nickel. The thickness of the metallic fill material that is deposited for each first redistribution wiring interconnect 580 may be in a range from 2 microns to 40 microns, such as from 4 microns to 10 microns, although lesser or greater thicknesses may also be used. The total number of levels of wiring in the first redistribution structure 500 (i.e., the levels of the first redistribution wiring interconnects 580) may be in a range from 1 to 10.

In one embodiment, the first redistribution wiring interconnects 580 and the optional first interconnect-level alignment structures 584 may be formed such that the first redistribution wiring interconnects 580 and the optional first interconnect-level alignment structures 584 are not in electrical contact with any of the alignment via structures 484. The alignment via structures 484 may be used as alignment marks during patterning of the first redistribution dielectric layers 560 and during formation of the first redistribution wiring interconnects 580.

The first bonding structures 588 may comprise microbump structures that may be subsequently used to attach semiconductor dies. The metallic fill material for the microbump structures may include copper. The first bonding structures 588 may have horizontal cross-sectional shapes of rectangles, rounded rectangles, or circles. Other horizontal cross-sectional shapes may be within the contemplated scope of disclosure. Typically, the first bonding structures 588 may be configured for microbump bonding, and may have a thickness in a range from 5 microns to 100 microns, although lesser or greater thicknesses may also be used. In one embodiment, the first bonding structures 588 within each unit area UA may be formed as at least one array of microbumps (such as copper pillars). Each of the microbumps may have a lateral dimension in a range from 10 microns to 50 microns, and may have a pitch in a range from 20 microns to 100 microns.

Figure 6:
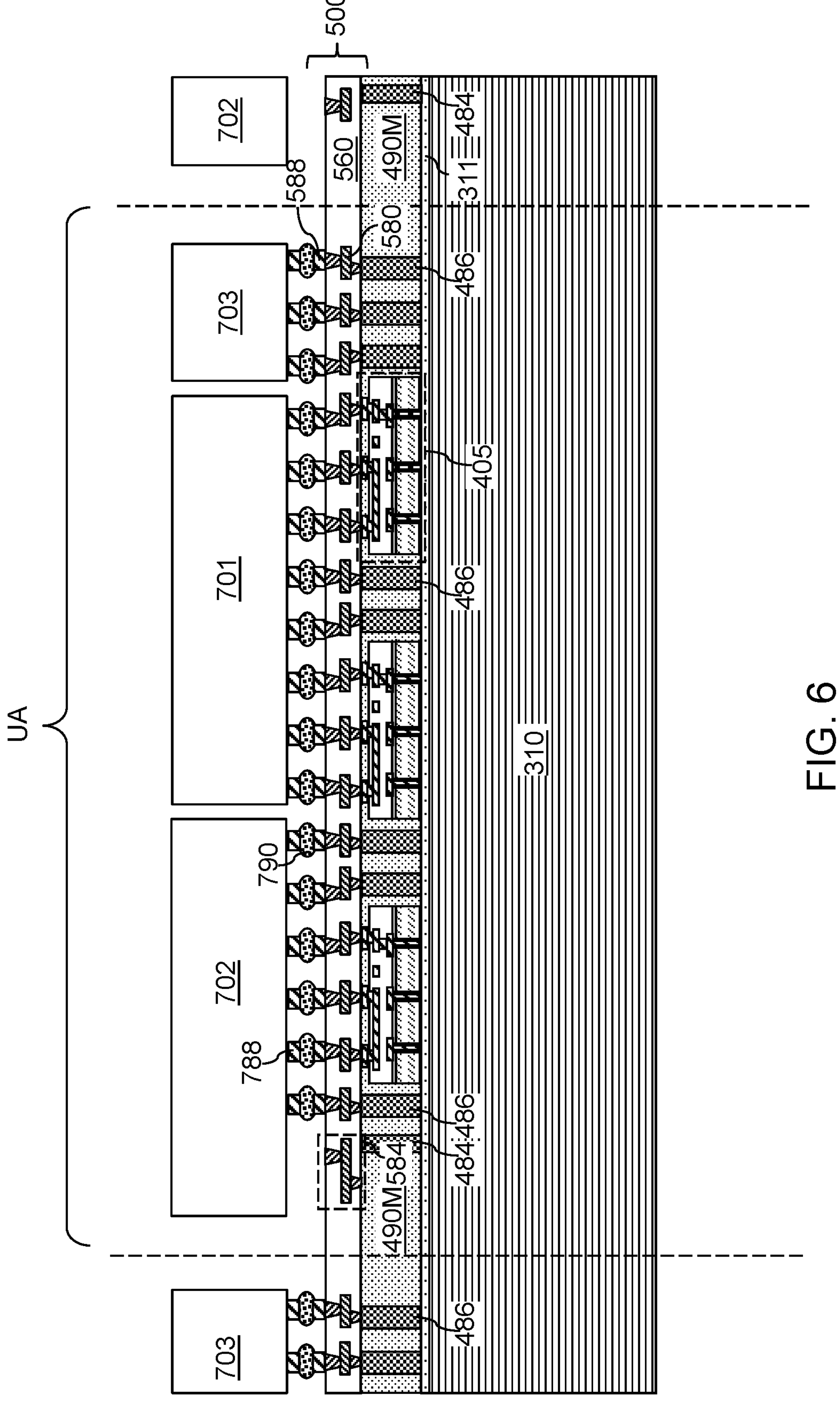
FIG. 6 is a vertical cross-sectional view of the embodiment structure after attaching semiconductor dies to the first redistribution structure according to an embodiment of the present disclosure.

Referring to FIG. 6, a set of at least one semiconductor die (701, 702, 703) may be bonded to a respective set of first bonding structures 588 within each unit area UA. each composite interposer 400. Each set of at least one semiconductor die (701, 702, 703) includes at least one semiconductor die, and may comprise a plurality of semiconductor dies (701, 702, 703). For example, each set of at least one semiconductor die (701, 702, 703) may include at least one system-on-chip (SoC) die (701, 702) and/or at least one memory die 703. Each SoC die (701, 702) may comprise an application processor die, a central processing unit die, or a graphic processing unit die. In one embodiment, the at least one memory die 703 may comprise a high bandwidth memory (HBM) die that includes a vertical stack of static random access memory dies. In one embodiment, the at least one semiconductor die (701, 702, 703) may include at least one system-on-chip (SoC) die (701, 702) and at least one high bandwidth memory (HBM) die. Each HBM die may comprise a vertical stack of static random access memory (SRAM) dies that are interconnected to one another through arrays of microbumps and are laterally surrounded by a respective molding material enclosure frame.

Each semiconductor die (701, 702, 703) may comprise a respective array of on-die bump structures 788. Solder material portions may be applied to the on-die bump structures 788 of the semiconductor dies (701, 702, 703), or may be applied to the first bonding structures 588. The solder material portions are herein referred to as die-interposer-bonding (DIB) solder material portions 790, or as first solder material portions. Each of the semiconductor dies (701, 702, 703) may be positioned in a facedown position such that on-die bump structures 788 face the first bonding structures 588. Placement of the semiconductor dies (701, 702, 703) may be performed using a pick and place apparatus such that each of the on-die bump structures 788 may face a respective one of the first bonding structures 588. Each set of at least one semiconductor die (701, 702, 703) may be placed within a respective unit area. A DIB solder material portion 790 is attached to one of the on-die bump structure 788 and the first bonding structure 588 for each facing pair of an on-die bump structure 788 and a first bonding structure 588.

In one embodiment, the on-die bump structures 788 and the first bonding structures 588 may be configured for microbump bonding. In this embodiment, each of the on-die bump structures 788 and the first bonding structures 588 may be configured as copper pillar structures having a diameter in a range from 10 microns to 50 microns, and may have a respective height in a range from 5 microns to 100 microns. The pitch of the microbumps in the direction of periodicity may be in a range from 20 microns to 100 microns, although lesser and greater pitches may also be used. Upon reflow, the lateral dimensions of each DIB solder material portion 790 may be in a range from 100% to 150% of the lateral dimension (such as a diameter) of the adjoined on-die bump structure 788 or of the adjoined first bonding structure 588.

Figure 7:
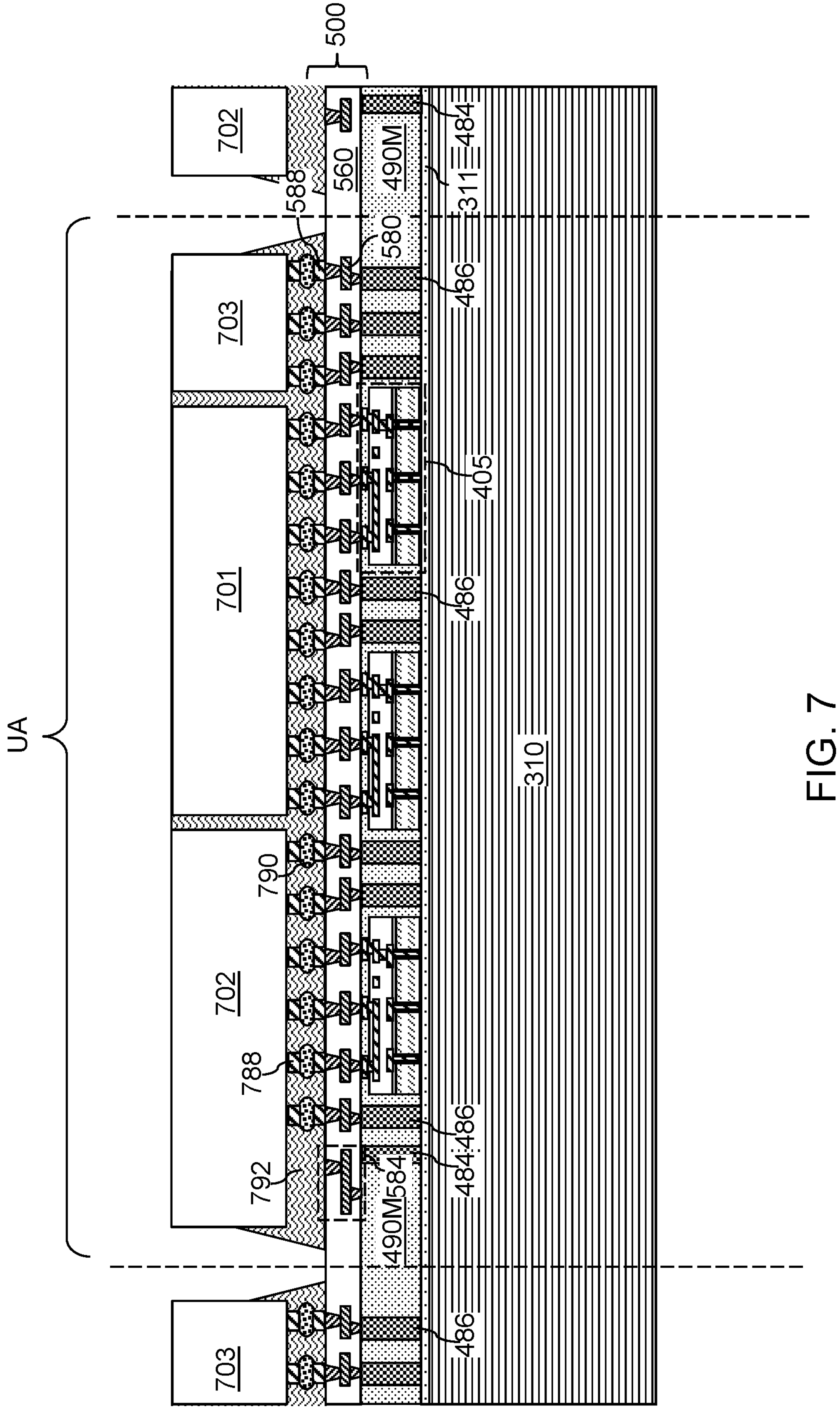
FIG. 7 is a vertical cross-sectional view of the embodiment structure after formation of die-side underfill material portions according to an embodiment of the present disclosure.

Referring to FIG. 7, a die-side underfill material may be applied into each gap between the first redistribution structure 500 and a respective set of at least one semiconductor die (701, 702, 703). The die-side underfill material may comprise any underfill material known in the art. A die-side underfill material portion 792 may be formed within each unit area UA between the first redistribution structure 500 and the respective set of at least one semiconductor die (701, 702, 703). The die-side underfill material portions 792 may be formed by injecting the die-side underfill material around a respective array of DIB solder material portions 790 in a respective unit area UA. Any known underfill material application method may be used, which may be, for example, the capillary underfill method, the molded underfill method, or the printed underfill method.

A die-side underfill material portion 792 may laterally surround, and contact, a respective set of the DIB solder material portions 790 within the unit area UA. The die-side underfill material portion 792 may be formed around, and contact, the DIB solder material portions 790, the first bonding structures 588, and the on-die bump structures 788 in the unit area. Generally, at least one semiconductor die (701, 702, 703) comprising a respective set of on-die bump structures 788 is attached to the first redistribution structure 500 through a respective set of DIB solder material portions 790 within each unit area UA.

Figure 8:
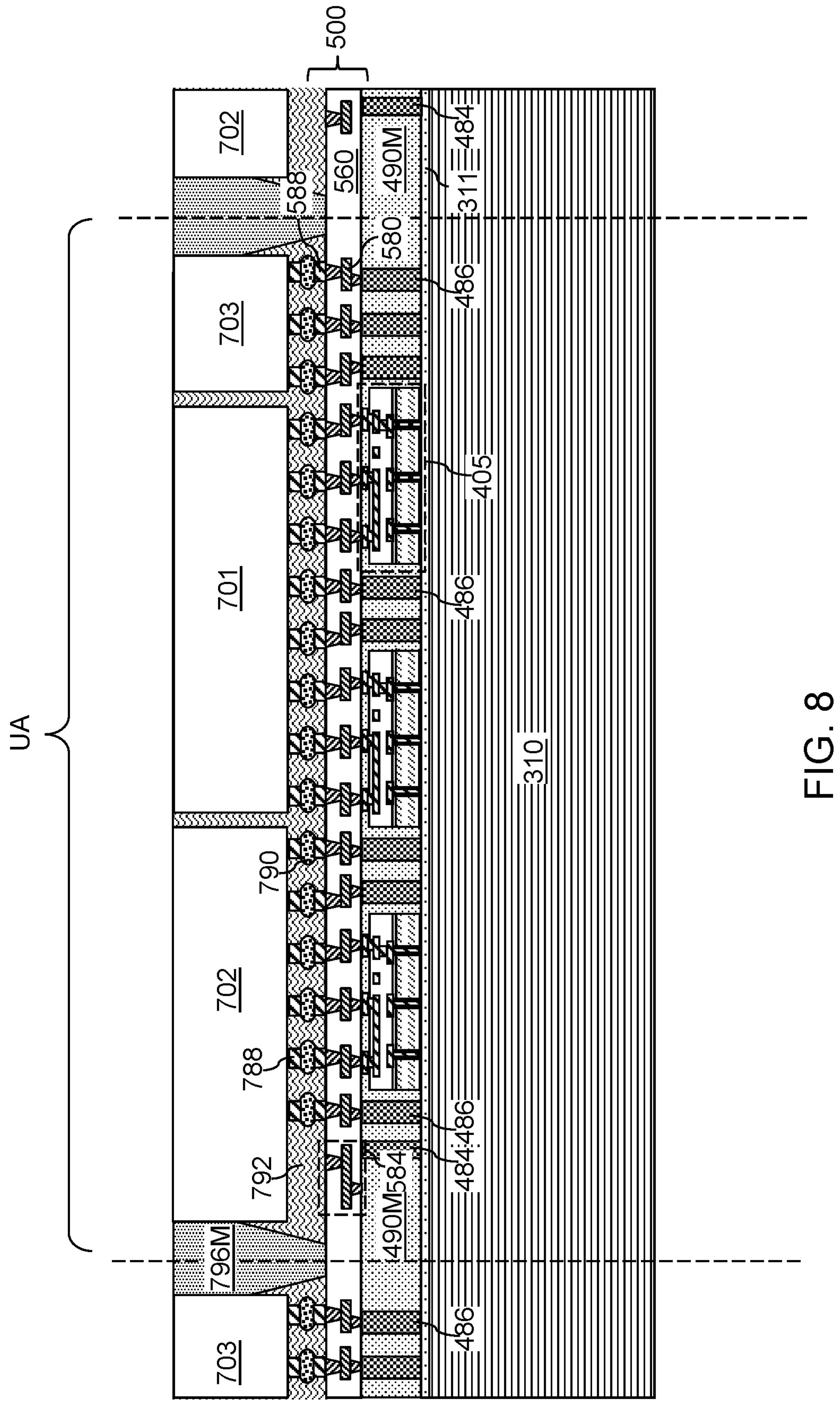
FIG. 8 is a vertical cross-sectional view of the embodiment structure after formation of a die-level molding compound matrix according to an embodiment of the present disclosure.

Referring to FIG. 8, a molding compound (MC) may be applied to the gaps between assemblies of a respective set of semiconductor dies (701, 702, 703) and a respective die-side underfill material portion 792. The MC may include any material that may be used for the interposer-level MC matrix 490M discussed above. The MC may include epoxy resin, hardener, silica (as a filler material), and other additives. The MC may be cured at a curing temperature to form an MC matrix, which is herein referred to as a die-level MC matrix 796M or as a second MC matrix. The die-level MC matrix 796M laterally surrounds and embeds each assembly of a set of semiconductor dies (701, 702, 703) and a die-side underfill material portion 792. The die-level MC matrix 796M includes a plurality of molding compound (MC) die frames that are laterally adjoined to one another. Each MC die frame is a portion of the die-level MC matrix 796M that is located within a respective unit area UA. Thus, each MC die frame laterally surrounds, and embeds, a respective a set of semiconductor dies (701, 702, 703) and a respective die-side underfill material portion 792. Young's modulus of pure epoxy is about 3.35 GPa, and Young's modulus of the MC may be higher than Young's modulus of pure epoxy due to additives therein. Thus, Young's modulus of the die-level MC matrix 796M may be greater than 3.5 GPa.

Portions of the die-level MC matrix 796M that overlies the horizontal plane including the top surfaces of the semiconductor dies (701, 702, 703) may be removed by a planarization process. For example, the portions of the die-level MC matrix 796M that overlies the horizontal plane may be removed using a chemical mechanical planarization (CMP). The reconstituted wafer that overlies the first carrier wafer 310 comprises a combination of the die-level MC matrix 796M, the semiconductor dies (701, 702, 703), the die-side underfill material portions 792, the first redistribution structure 500, a two-dimensional array of combinations of at least one LSI bridge 405, TIV structures 486, and alignment via structures 484. Each portion of the die-level MC matrix 796M located within a unit area UA constitutes an MC die frame.

Figure 9:
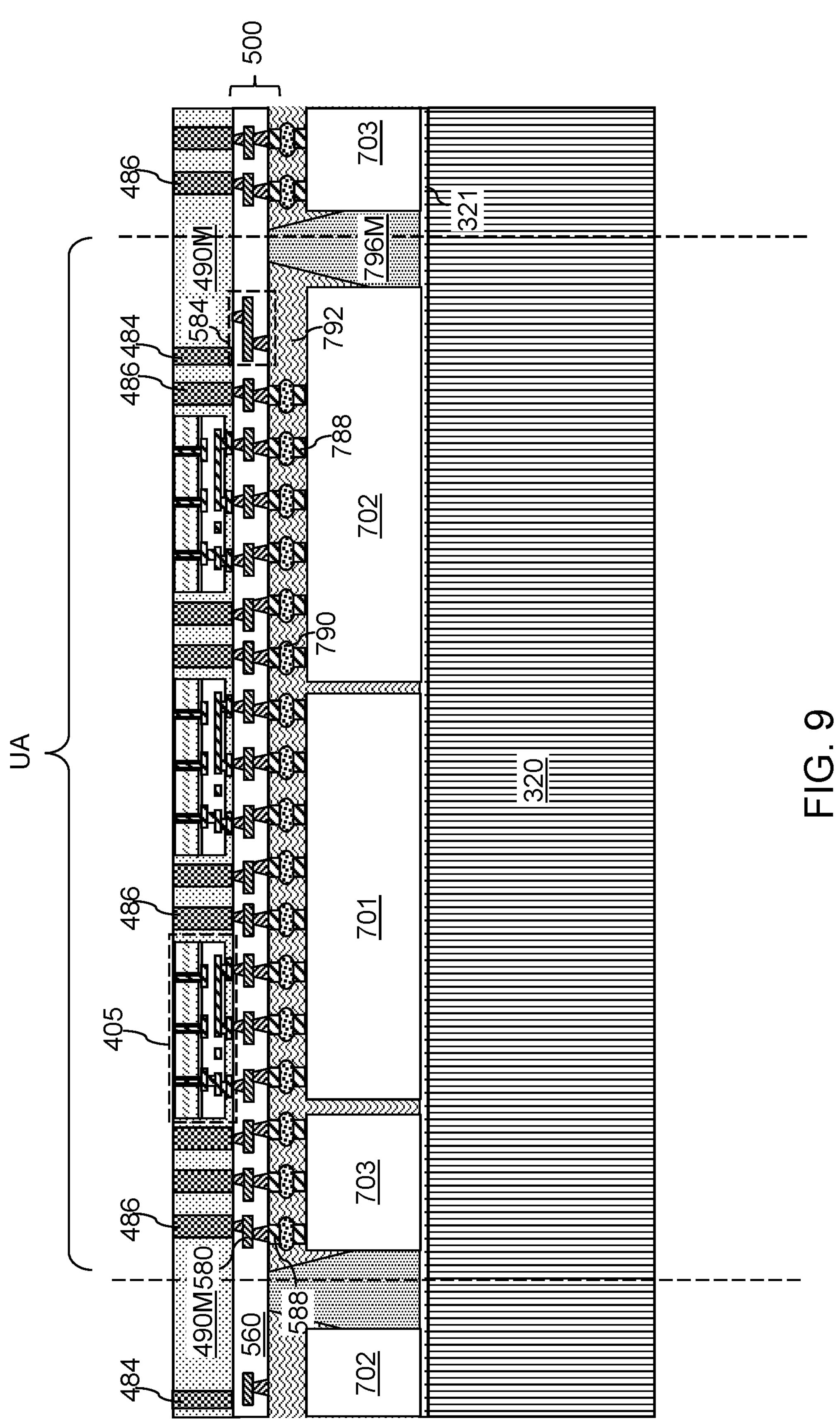
FIG. 9 is a vertical cross-sectional view of the embodiment structure after attaching a second carrier wafer to a reconstituted wafer and detaching the first carrier wafer according to an embodiment of the present disclosure.

Referring to FIG. 9, a second adhesive layer 321 may be applied over the die-level MC matrix 796M. The second adhesive layer 321 may comprise a light-to-heat conversion (LTHC) layer or a thermally decomposing adhesive material layer depending on the removal mechanism to be subsequently used. A second carrier wafer 320 may be attached to the die-level MC matrix 796M and the semiconductor dies (701, 702, 703) through the second adhesive layer 321. The second carrier wafer 320 may comprise any material that may be used for the first carrier wafer 310, and generally may have about the same thickness range as the first carrier wafer 310.

The first carrier wafer 310 may be detached from the reconstituted wafer. In some embodiments, the first carrier wafer 310 and the first adhesive layer 311 may be removed by backside grinding. Optionally, at least one selective etch process (such as a wet etch process or a reactive ion etch process) may be used in conjunction with the backside grinding process to minimize collateral removal of surface portions of the LSI bridges 405, the TIV structures 486, and the alignment via structures 484. Alternatively or additionally, in embodiments in which the first carrier wafer 310 includes an optically transparent material and the first adhesive layer 311 comprises a light-to-heat conversion material, irradiation through the first carrier wafer 310 may be used to detach the first carrier wafer 310. In embodiments in which the first adhesive layer 311 comprises a thermally decomposable adhesive material, an anneal process or a laser irradiation may be used to detach the first carrier wafer 310. A suitable clean process may be performed to remove residual portions of the first adhesive layer 311.

Figure 10:
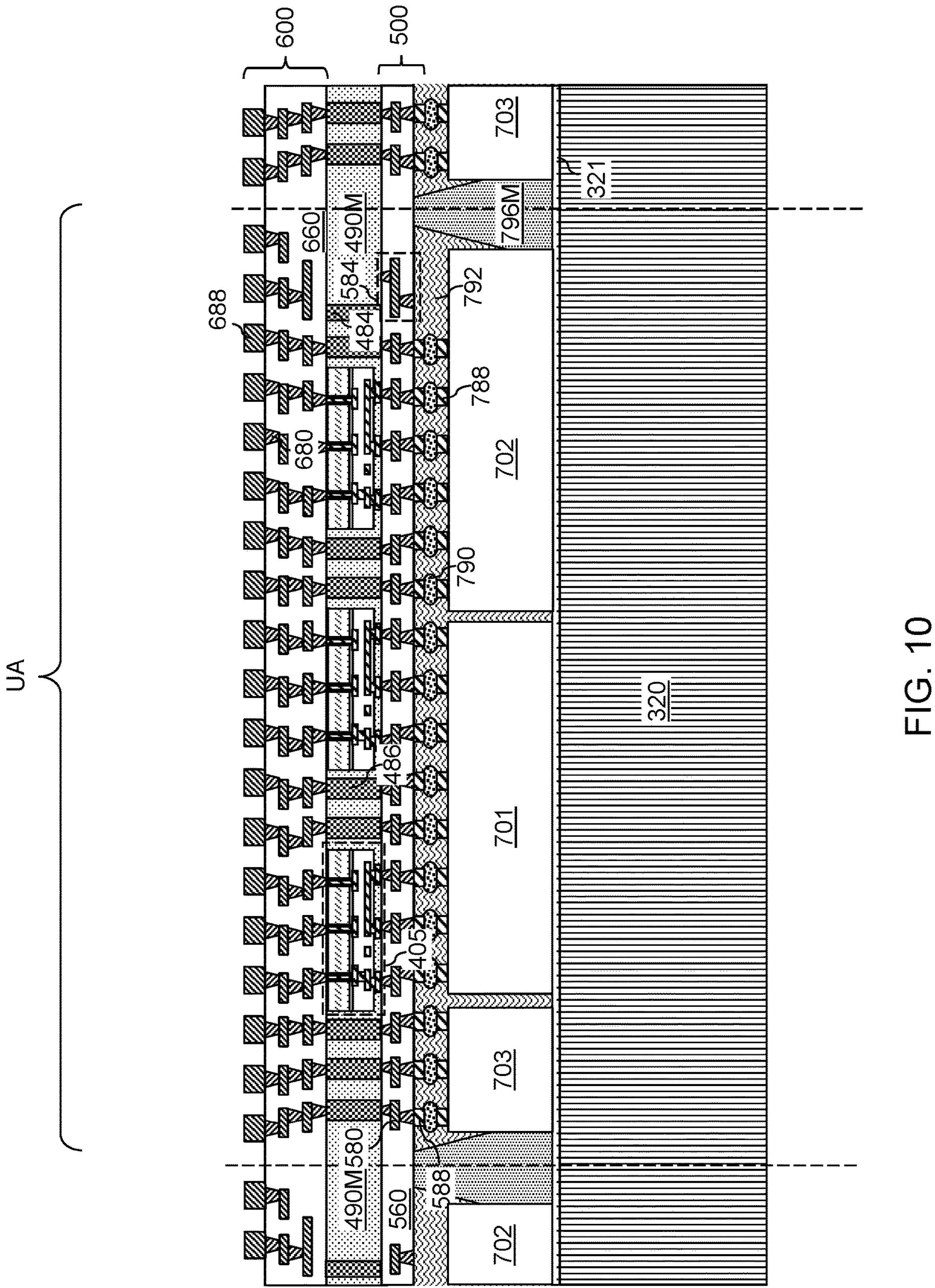
FIG. 10 is a vertical cross-sectional view of the embodiment structure after formation of a second redistribution structure according to an embodiment of the present disclosure.

Referring to FIG. 10, a second redistribution structure 600 may be formed on a physically exposed side of the two-dimensional repetition of the unit via assembly and the interposer-level MC matrix 490M. The second redistribution structure 600 comprises second redistribution wiring interconnects 680, optional second interconnect-level alignment structures (not shown), second redistribution dielectric layers 660, and second bonding structures 688. Generally, the second redistribution structure 600 may be formed in the same manner as the first redistribution structures 500 with suitable changes in the lithographic pattern and/or in the thicknesses and material compositions of material layers. The second bonding structures 688 may be formed as bonding pads that are configured for controlled collapse chip connection (C4) bonding.

Figure 11:
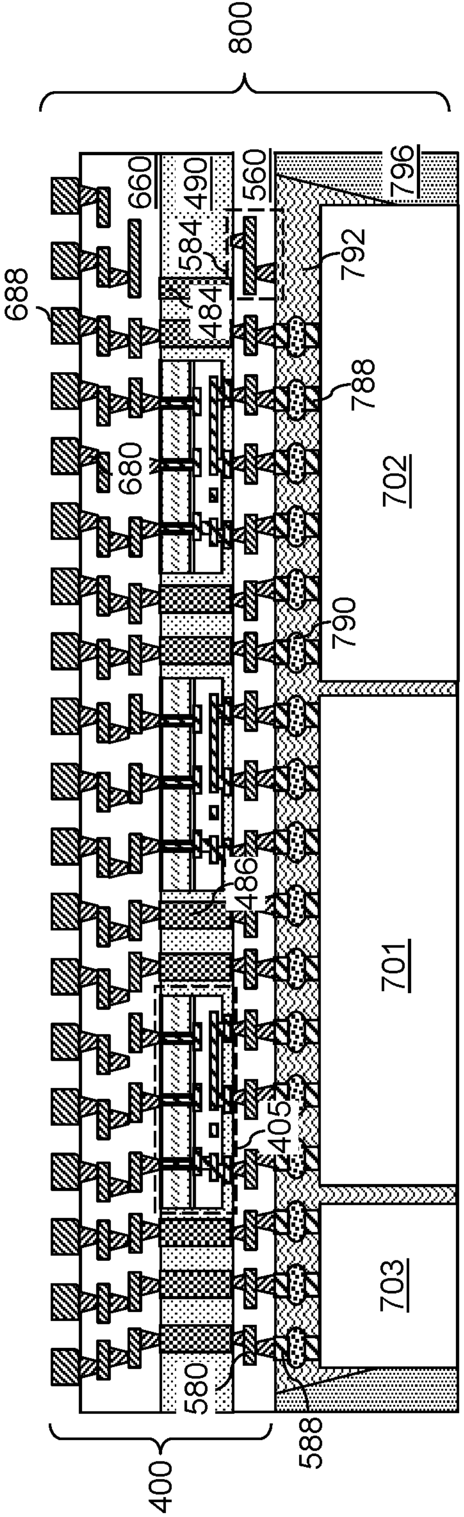
FIG. 11 is a vertical cross-sectional view of a composite interposer according to an embodiment of the present disclosure.

Referring to FIG. 11, the second carrier wafer 320 may be detached from the reconstituted wafer. In embodiments in which the second carrier wafer 320 includes an optically transparent material and the second adhesive layer 321 comprises a light-to-heat conversion material, irradiation through the second carrier wafer 320 may be used to detach the second carrier wafer 320. In embodiments in which the second adhesive layer 321 comprises a thermally decomposable adhesive material, an anneal process or a laser irradiation may be used to detach the second carrier wafer 320. A suitable clean process may be performed to remove residual portions of the second adhesive layer 321. A horizontal surface of the die-level MC matrix 796M may be physically exposed.

The reconstituted wafer includes a two-dimensional array of composite interposers 400, and further includes a two-dimensional array of sets of at least one semiconductor die (701, 702, 703) that are bonded to a respective composite interposer 400. The reconstituted wafer may be diced along dicing channels (which correspond to the dicing lines DL described above) by performing a dicing process. The dicing channels correspond to the boundaries between neighboring pairs of unit areas UA. Each diced unit from the reconstituted wafer comprises a fan-out package 800. Each diced portion of the die-level MC matrix 796M constitutes a die-level MC frame 796. Each diced portion of the interposer-level MC matrix 490M constitutes an interposer-level MC frame 490.

The diced portions of the reconstituted wafer comprise fan-out packages 800. Each fan-out package 800 comprises at least one semiconductor die (701, 702, 703), a composite interposer 400, a die-side underfill material portion 792, a die-level MC frame 796, and at least one array of DIB solder material portions 790. Each composite interposer 400 comprises a unit via assembly including TIV structures 486 and at least two alignment mark via assemblies (AMVA1, AMVA2) comprising a respective set of alignment via structures 484, at least one LSI bridge 405, an interposer-level MC frame 490, a first redistribution structure 500, and a second redistribution structure 600.

Figure 12:
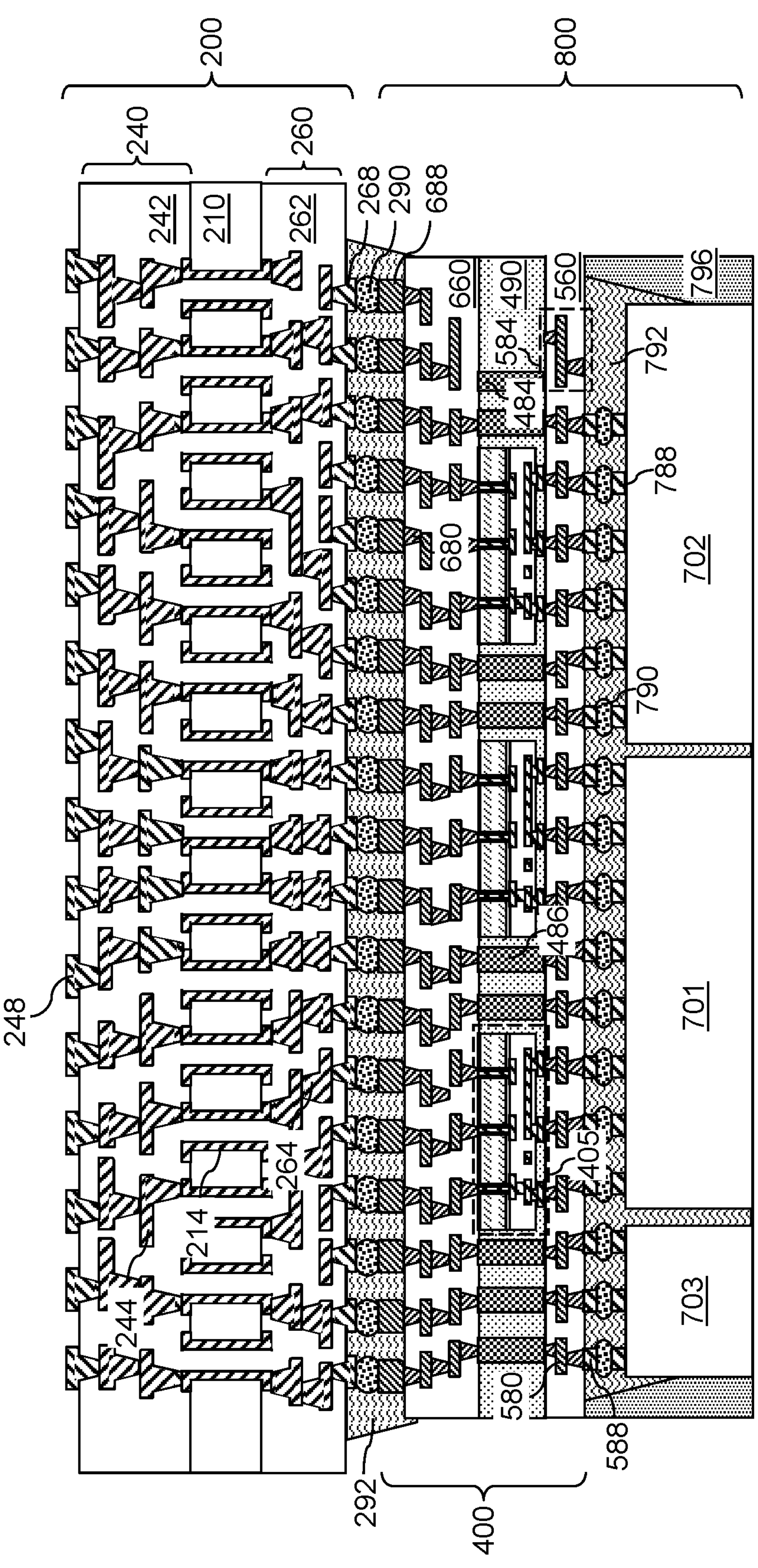
FIG. 12 is a vertical cross-sectional view of an assembly of a composite interposer and a packaging substrate according to an embodiment of the present disclosure.

Referring to FIG. 12, a packaging substrate 200 may be bonded to the fan-out package 800. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layers. dielectric interlayers, and/or at least one embedded interposer (such as a silicon interposer). Such a system-integrated packaging substrate may include layer-to-layer interconnections using solder material portions, microbumps, underfill material portions (such as molded underfill material portions), and/or an adhesion film. While the present disclosure is described using a cored packaging substrate, it is understood that the scope of the present disclosure is not limited by any particular type of substrate package. For example, an SoIS may be used in lieu of a cored packaging substrate. In embodiments in which SoIS is used, the core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners (not illustrated) may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the chip-side surface laminar circuit 260 comprises chip-side wiring interconnects 264 that are connected to an array of substrate bonding pads 268. The array of substrate bonding pads 268 may be configured to allow bonding through C4 solder balls. The board-side surface laminar circuit 240 comprises board-side wiring interconnects 244 that are connected to an array of board-side bonding pads 248. The array of board-side bonding pads 248 is configured to allow bonding through solder joints having a greater dimension than the C4 solder balls. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

The fan-out package 800 may be attached to the packaging substrate 200 using the second solder material portions, which are herein referred to interposer-substrate-bonding (ISB) solder material portions 290. Specifically, each of the ISB solder material portions 290 may be bonded to a respective one of the substrate bonding pads 268 and to a respective one of the second bonding structures 688 located on the composite interposer 400. A reflow process may be performed to reflow the ISB solder material portions 290 such that each ISB solder material portion 290 may be bonded to a respective one of the substrate bonding pads 268 and to a respective one of the second bonding structures 688.

An underfill material may be applied into a gap between the composite interposer 400 and the packaging substrate 200. The underfill material may comprise any underfill material known in the art. An underfill material portion may be formed around the ISB solder material portions 290 in the gap between the composite interposer 400 and the packaging substrate 200. This underfill material portion is herein referred to as an interposer-substrate underfill material portion 292, or as an IP underfill material portion 292.

A stiffener ring (not shown) may be optionally attached to the composite interposer 400 or the packaging substrate 200.

Figure 13:
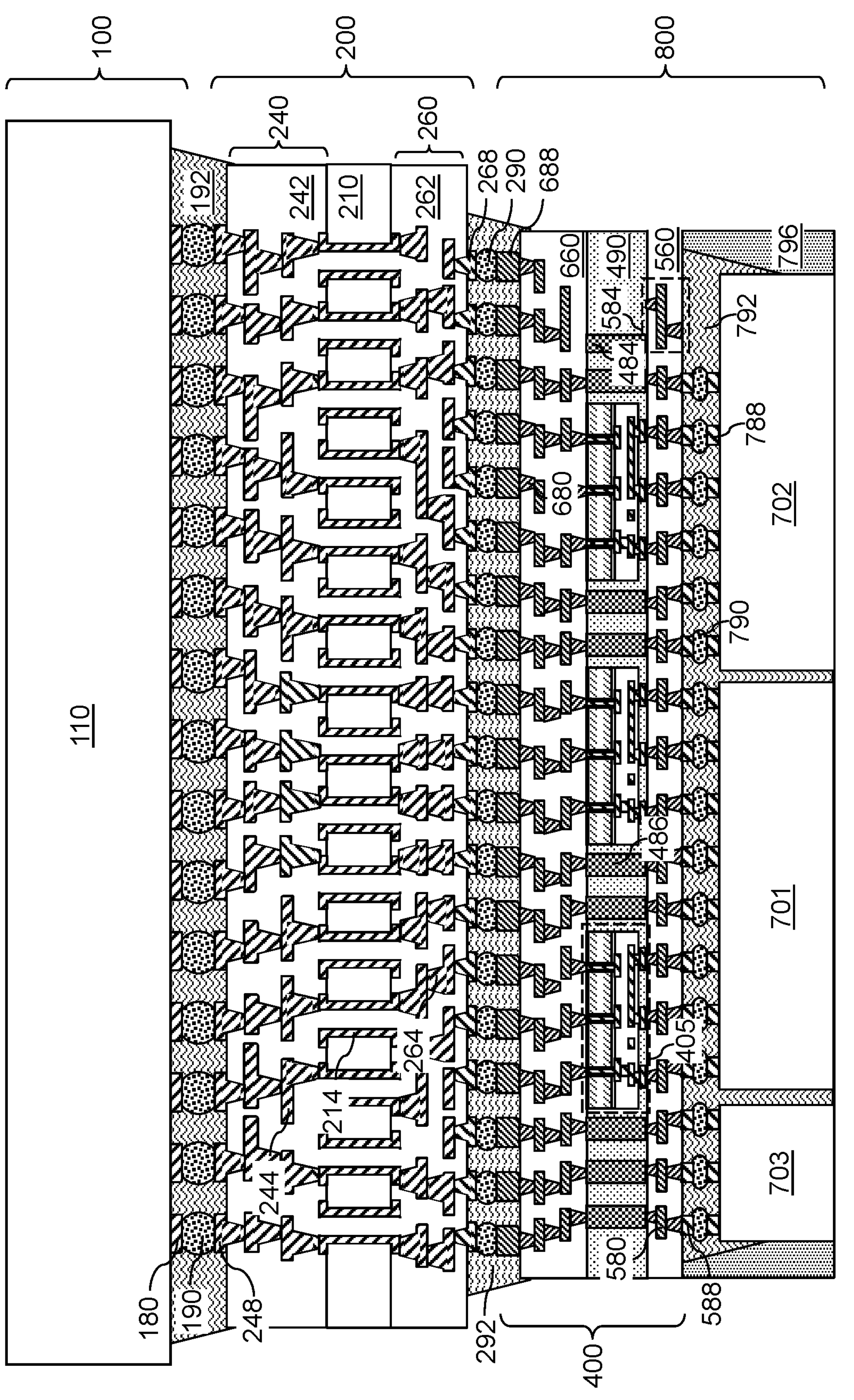
FIG. 13 is a vertical cross-sectional view of an assembly of a composite interposer, a packaging substrate, and a printed circuit board according to an embodiment of the present disclosure.

Referring to FIG. 13, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An additional underfill material portion, which is herein referred to as a board-substrate underfill material portion 192 or a BS underfill material portion 192, may be formed around the solder joints 190 by applying and shaping an underfill material. The packaging substrate 200 is attached to the PCB 100 through the array of solder joints 190.

Figure 14:
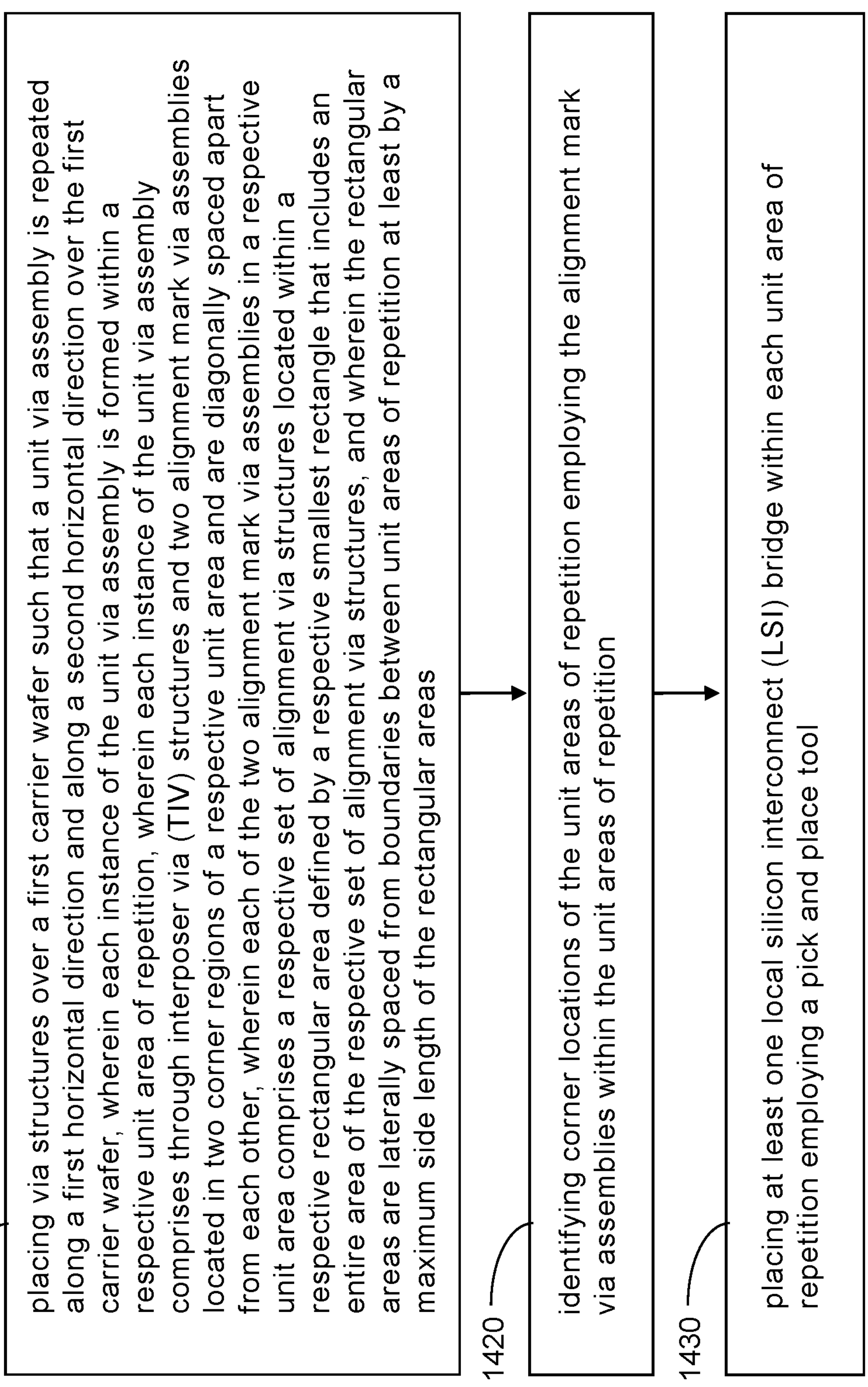
FIG. 14 is a first flowchart illustrating steps for forming a semiconductor structure according to an embodiment of the present disclosure.

Referring to FIG. 14, a first flowchart illustrates steps for forming a semiconductor structure according to an embodiment of the present disclosure.

Referring to step 1410 and FIGS. 1A-1D, via structures (486, 484) may be formed over a first carrier wafer 310 such that a unit via assembly structure is repeated along a first horizontal direction hd1 and along a second horizontal direction hd2 over the first carrier wafer 310. Each instance of the unit via assembly is formed within a respective unit area UA of repetition. Each instance of the unit via assembly comprises through integrated-fan-out via (TIV) structures 486 and two alignment mark via assemblies (AMVA1, AMVA2) located in two corner regions of a respective unit area UA and are diagonally spaced apart from each other. Each of the two alignment mark via assemblies (AMVA1, AMVA2) in a respective unit area UA comprises a respective set of alignment via structures 484 located within a respective rectangular area defined by a respective smallest rectangle that includes an entire area of the respective set of alignment via structures 484. The rectangular areas are laterally spaced from boundaries between unit areas UA of repetition at least by a maximum side length (the greater of AML and AMW) of the rectangular areas.

Referring to step 1420 and FIGS. 1A-1D, corner locations of the unit areas UA of repetition may be identified using the alignment mark via assemblies (AMVA1, AMVA2) within the unit areas UA of repetition. Any pattern recognition apparatus, such as one within a pick and place tool, may be used.

Referring to step 1430 and FIGS. 2A-13, at least one local silicon interconnect (LSI) bridge 405 may be placed within each unit area UA of repetition using a pick and place tool.

Figure 15:
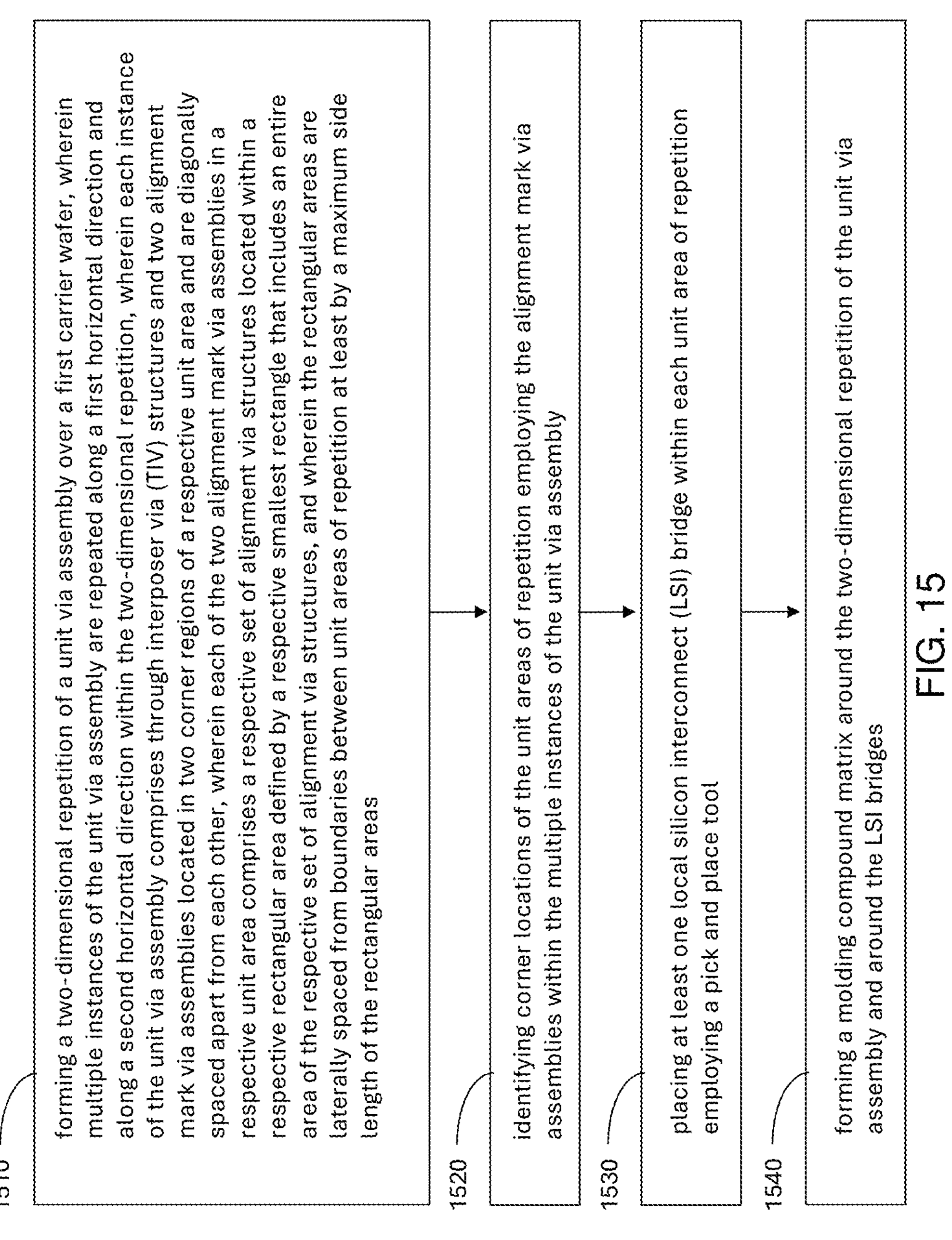
FIG. 15 is a second flowchart illustrating steps for forming a semiconductor structure according to an embodiment of the present disclosure.

Referring to FIG. 15, a second flowchart illustrates steps for forming a semiconductor structure according to an embodiment of the present disclosure.

Referring to step 1510 and FIGS. 1A-1D, a two-dimensional repetition of a unit via assembly structure may be formed over a first carrier wafer 310. Multiple instances of the unit via assembly are repeated along a first horizontal direction hd1 and along a second horizontal direction hd2 within the two-dimensional repetition. Each instance of the unit via assembly comprises through integrated-fan-out via (TIV) structures 486 and two alignment mark via assemblies (AMVA1, AMVA2) located in two corner regions of a respective unit area UA and are diagonally spaced apart from each other. Each of the two alignment mark via assemblies (AMVA1, AMVA2) in a respective unit area UA comprises a respective set of alignment via structures 484 located within a respective rectangular area which is defined by a respective smallest rectangle that includes an entire area of the respective set of alignment via structures 484. The rectangular areas are laterally spaced from boundaries between unit areas UA of repetition at least by a maximum side length (the greater of AML and AMW) of the rectangular areas.

Referring to step 1520 and FIGS. 1A-1D, corner locations of the unit areas UA of repetition may be identified using the alignment mark via assemblies (AMVA1, AMVA2) within the multiple instances of the unit via assembly. Any pattern recognition apparatus, such as one within a pick and place tool, may be used.

Referring to step 1530 and FIGS. 2A-2C, at least one local silicon interconnect (LSI) bridge 405 may be placed within each unit area UA of repetition using a pick and place tool.

Referring to step 1540 and FIGS. 3-13, a molding compound matrix (such as an interposer-level molding compound (MC) matrix 490M or an interposer-level MC frame 490) may be formed around the two-dimensional repetition of the unit via assembly structure and around the LSI bridges 405.

Referring to all drawings and according to various embodiments of the present disclosure, a semiconductor structure comprising a composite interposer 800 is provided. The composite interposer 800 comprises: at least one local silicon interconnect (LSI) bridge 405 laterally surrounded by a molding compound (MC) interposer frame 490; through interposer via (TIV) structures 486 vertically extending through the MC interposer frame 490; and two alignment mark via assemblies (AMVA1, AMVA2) located in two corner regions of the MC interposer frame 490 and diagonally spaced apart from each other, wherein: each of the two alignment mark via assemblies (AMVA1, AMVA2) comprises a respective set of alignment via structures 484 located within a respective rectangular area defined by a respective smallest rectangle that includes an entire area of the respective set of alignment via structures 484; and the rectangular areas are laterally spaced from each of the sidewalls of the MC interposer frame 490 at least by a maximum side dimension (i.e., the greater of AML and AMW) of the rectangular areas.

In one embodiment, each of the alignment via structures 484 comprises a same material as the TIV structures 486, and has a same height as the TIV structures 486. In one embodiment, each of the TIV structures 486 has a respective cylindrical shape with a first radius r1 in a respective horizontal cross-sectional shape; and each of the alignment via structures 484 has a respective cylindrical shape with a second radius r2 in a respective horizontal cross-sectional shape. In one embodiment, the second radius r2 is the same as the first radius r1.

In one embodiment, each of the two alignment mark via assemblies (AMVA1, AMVA2) comprises: a first alignment via structure 4841 having a first vertical axis VA1 passing through a geometrical center thereof; a second alignment via structure 4842 having a second vertical axis VA2 passing through a geometrical center thereof; and a third alignment via structure 4843 having a third vertical axis VA3 passing through a geometrical center thereof, wherein a vertical plane including the first vertical axis VA1 and the second vertical axis VA2 and a vertical plane including the first vertical axis VA1 and the third vertical axis VA3 intersect at the first vertical axis VA1 at an obtuse angle $\alpha$.

The various embodiments of the present disclosure may be used to reduce error during a pick and place operation that places LSI bridges 405 in openings in the arrays of TIV structures 486. Specifically, an irregular pattern for alignment mark via assemblies (AMVA1, AMVA2) in combination of sufficient spacing between each neighboring pair of alignment mark via assemblies (AMVA1, AMVA2) may prevent pattern recognition errors during determination of die corner locations at which dicing lines DL intersect.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:

forming via structures over a first carrier wafer such that a unit via assembly structure is repeated along a first horizontal direction and along a second horizontal direction over the first carrier wafer, wherein each instance of the unit via assembly structure is formed within a respective unit area of repetition, wherein each instance of the unit via assembly comprises through interposer via (TIV) structures and two alignment mark via assemblies located in two corner regions of the respective unit area of repetition and are diagonally spaced apart from each other, wherein each of the two alignment mark via assemblies in the respective unit area of repetition comprises a respective set of alignment via structures located within a respective rectangular area defined by a respective smallest rectangle that includes an entire area of the respective set of alignment via structures, and wherein each rectangular area is laterally spaced from boundaries between unit areas of repetition at least by a maximum side length of the rectangular area;

identifying corner locations of the unit areas of repetition using the alignment mark via assemblies within the unit areas of repetition; and placing at least one local silicon interconnect (LSI) bridge within each unit area of repetition using a pick and place tool.

2. The method of claim 1, wherein each set of alignment via structures comprises a respective set of metallic via structures.

3. The method of claim 2, wherein the metallic via structures has a same material composition as the TIV structures.

4. The method of claim 2, wherein:

each of the TIV structures has a respective cylindrical shape with a first radius in a respective horizontal cross-sectional shape; and each alignment via structures in the set of alignment via structures has a respective cylindrical shape with a second radius in a respective horizontal cross-sectional shape.

5. The method of claim 4, wherein:

the second radius is the same as the first radius; and the TIV structures and the alignment via structures have a same height.

6. The method of claim 1, wherein each of the two alignment mark via assemblies in each instance of the unit via assembly comprises:

a first alignment via structure having a first vertical axis passing through a first geometrical center thereof;

a second alignment via structure having a second vertical axis passing through a second geometrical center thereof; and a third alignment via structure having a third vertical axis passing through a third geometrical center thereof, wherein the first vertical axis, the second vertical axis, and the third vertical axis form an obtuse triangle in a top-down view such that an obtuse angle is located at a corner located at the first vertical axis.

7. The method of claim 6, wherein each of the two alignment mark via assemblies in each instance of the unit via assembly comprises:

a fourth alignment via structure having a fourth vertical axis passing through a fourth geometrical center thereof; and a fifth alignment via structure having a fifth vertical axis passing through a fifth geometrical center thereof, wherein the third vertical axis, the fourth vertical axis, and the fifth vertical axis form three corners of an acute triangle in the top-down view.

8. The method of claim 1, wherein, within each of the two alignment mark via assemblies in each instance of the unit via assembly, each line connecting a geometrical center of an alignment via structure and a geometric center of another alignment via structure is not parallel to the first horizontal direction and is not parallel to the second horizontal direction in a plan view.

9. The method of claim 1, wherein, for each alignment mark via assembly located within a first unit via assembly selected from the unit via assemblies, a minimum lateral spacing between the alignment mark via assembly within the first unit via assembly and a neighboring unit via assembly is greater than a minimum lateral spacing between one of TIV structures within the first unit via assembly and the neighboring unit via assembly.

10. The method of claim 1, wherein:

neighboring instances of the unit via assembly that are laterally spaced apart along the first horizontal direction are laterally spaced apart by a first assembly spacing;

neighboring instances of the unit via assembly that are laterally spaced apart along the second horizontal direction are laterally spaced apart by a second assembly spacing; and neighboring instances of the alignment mark via assemblies are laterally spaced apart from each other by a lateral spacing that is greater than a square root of a sum of a square of the first assembly spacing and a square of the second assembly spacing.

11. The method of claim 10, wherein:

the first assembly spacing is at least 1 mm;

the second assembly spacing is at least 1 mm; and each side length of the rectangular areas of the alignment mark via assemblies is less than one half of the first assembly spacing and is less than one half of the second assembly spacing.

12. The method of claim 1, further comprising:

forming a molding compound matrix around the two-dimensional repetition of the unit via assembly structure and around the at least one LSI bridge; and dicing the molding compound matrix along the first horizontal direction and along the second horizontal direction between neighboring instances of the unit via assembly.

13. A method of forming a semiconductor structure, the method comprising:

forming multiple instances of a unit via assembly over a first carrier wafer, wherein each instance of the unit via assembly comprises through interposer via (TIV) structures and two alignment mark via assemblies located in two corner regions of a respective unit area of repetition and are diagonally spaced apart from each other, wherein each of the two alignment mark via assemblies in the respective unit area of repetition comprises a respective set of alignment via structures located within a respective rectangular area which is defined by a respective smallest rectangle that includes an entire area of the respective set of alignment via structures;

identifying corner locations of the unit areas of repetition using the alignment mark via assemblies within the multiple instances of the unit via assembly;

placing at least one local silicon interconnect (LSI) bridge within each unit area of repetition using a pick and place tool; and forming a molding compound matrix around the multiple instances of the unit via assembly structure and around the at least one LSI bridge.

14. The method of claim 13, further comprising:

forming a first redistribution structure comprising first redistribution wiring interconnects, first redistribution dielectric layers, and first bonding structures on a first side of multiple instances of the unit via assembly structure and the molding compound matrix; and attaching at least one semiconductor die to a respective subset of the first bonding structures over each instance of the unit via assembly.

15. The method of claim 14, further comprising:

attaching a second carrier wafer to the at least one semiconductor die;

detaching the first carrier wafer;

forming a second redistribution structure comprising second redistribution wiring interconnects, second redistribution dielectric layers, and second bonding structures on a second side of the multiple instances of the unit via assembly structure and the molding compound matrix; and dicing an assembly of the second redistribution structure, the multiple instances of the unit via assembly structure, the molding compound matrix, and the first redistribution structure.

16. A method of forming a semiconductor structure, the method comprising:

forming through interposer via (TIV) structures and alignment via structures over a carrier wafer, wherein the alignment via structures are arranged in a non-periodic pattern within each of two alignment mark via assemblies located in two corner regions of a unit area and diagonally spaced apart from each other;

identifying corner locations of the unit area using the non-periodic pattern of the alignment via structures within the two alignment mark via assemblies; and placing at least one local silicon interconnect (LSI) bridge within the unit area using a pick and place tool.

17. The method of claim 16, wherein, within each of the two alignment mark via assemblies, each line connecting a geometrical center of an alignment via structure and a geometrical center of another alignment via structure is not parallel to a first horizontal direction and is not parallel to a second horizontal direction in a plan view.

18. The method of claim 16, wherein each of the two alignment mark via assemblies comprises at least three alignment via structures, and wherein vertical axes passing through geometrical centers of the at least three alignment via structures form an obtuse triangle in a top-down view.

19. The method of claim 16, wherein the TIV structures and the alignment via structures comprise a same material and have a same height.

20. The method of claim 16, further comprising forming a molding compound matrix around the TIV structures, the alignment via structures, and the at least one LSI bridge.

* * * * *